(12) United States Patent
Matsumoto et al.

(10) Patent No.: US 11,452,210 B2
(45) Date of Patent: Sep. 20, 2022

(54) WIRING SUBSTRATE AND ELECTRONIC DEVICE

(71) Applicant: SHINKO ELECTRIC INDUSTRIES CO., LTD., Nagano (JP)

(72) Inventors: Takayuki Matsumoto, Nagano (JP); Tsukasa Nakanishi, Nagano (JP); Yukinori Hatori, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/094,656

(22) Filed: Nov. 10, 2020

(65) Prior Publication Data

US 2021/0153355 A1   May 20, 2021

(30) Foreign Application Priority Data

Nov. 15, 2019   (JP) .............................. JP2019-206690

(51) Int. Cl.
*H05K 1/11*  (2006.01)
*H05K 1/18*  (2006.01)

(52) U.S. Cl.
CPC .............. *H05K 1/186* (2013.01); *H05K 1/11* (2013.01); *H05K 1/181* (2013.01); *H05K 1/183* (2013.01); *H05K 2201/10674* (2013.01)

(58) Field of Classification Search
CPC .................... H05K 1/186; H05K 1/11; H05K 2201/10674; H05K 3/202; H01L 23/3107; H01L 23/49537; H01L 23/49548
See application file for complete search history.

(56) References Cited

U.S. PATENT DOCUMENTS

| | | | | |
|---|---|---|---|---|
| 5,032,895 A | * | 7/1991 | Horiuchi | ........... H01L 23/49527 |
| | | | | 257/695 |
| 11,056,462 B2 | * | 7/2021 | Eugene Lee | ...... H01L 23/49537 |
| 2012/0227261 A1 | | 9/2012 | Inui | |
| 2014/0247561 A1 | | 9/2014 | Inui | |

FOREIGN PATENT DOCUMENTS

| | | | |
|---|---|---|---|
| EP | 1429387 A2 | * | 6/2004 |
| JP | 2012191204 A | | 10/2012 |
| JP | 2015080812 A | * | 4/2015 |

* cited by examiner

*Primary Examiner* — Ishwarbhai B Patel
(74) *Attorney, Agent, or Firm* — Tarolli, Sundheim, Covell & Tummino LLP

(57) ABSTRACT

An embodiment is a wiring substrate that includes a first metal plate. The first metal plate includes a first electrode and a wiring, and the wiring includes a mount portion for an electronic component. The wiring substrate further includes a second metal plate. The second metal plate includes a second electrode diffusion-bonded to an upper surface of the first electrode. The second metal plate includes a first opening that exposes the mount portion. The first opening is large enough to accommodate the electronic component.

24 Claims, 29 Drawing Sheets

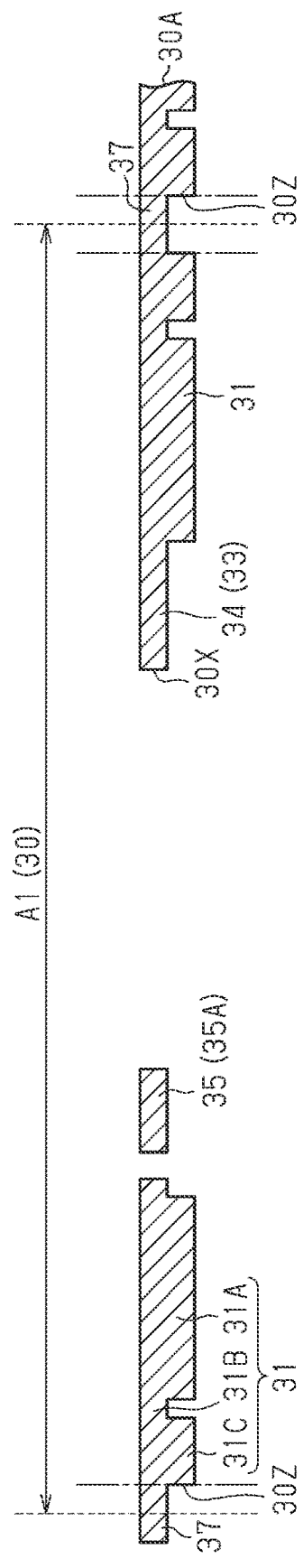

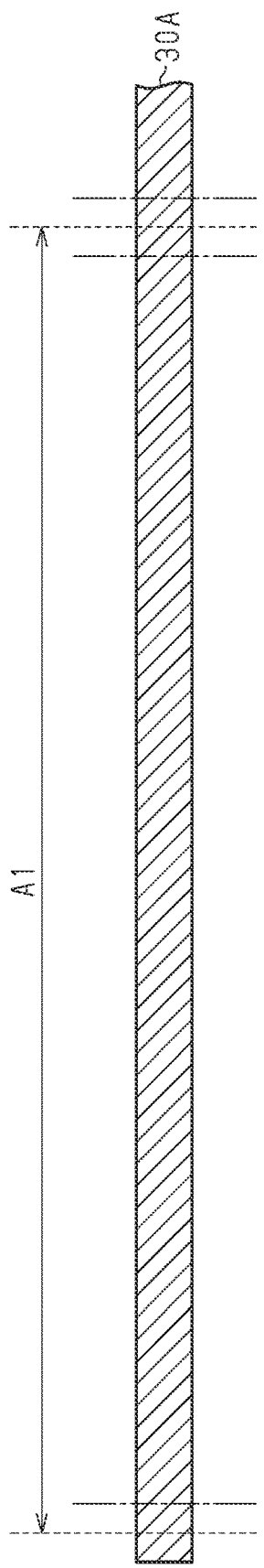
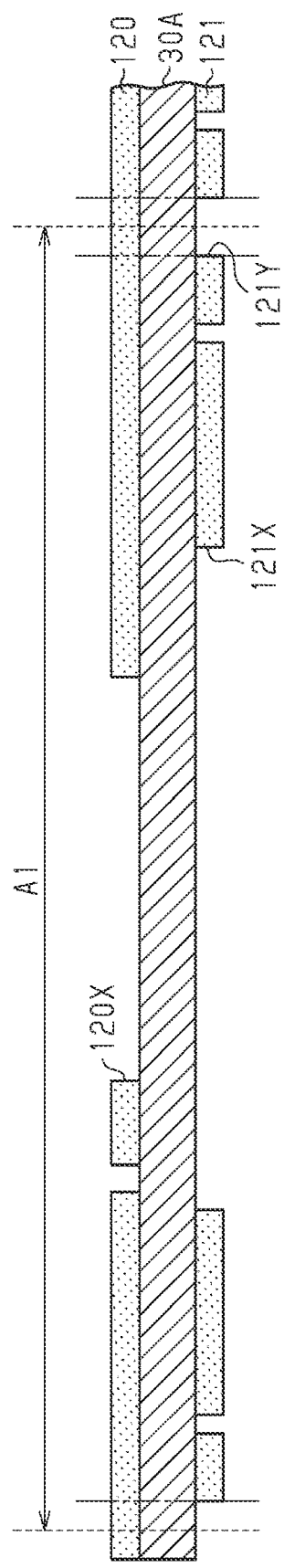
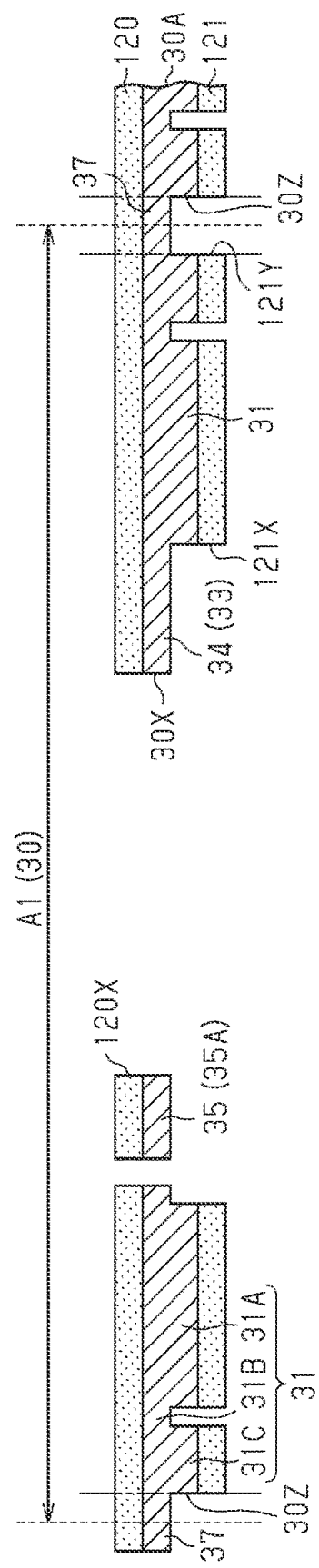

WIRING SUBSTRATE AND ELECTRONIC DEVICE

CROSS-REFERENCE TO RELATED APPLICATIONS

This application is based upon and claims the benefit of priority from prior Japanese Patent Application No. 2019-206690, filed on Nov. 15, 2019, the entire contents of which are incorporated herein by reference.

FIELD

The present disclosure relates to a wiring substrate, an electronic device, and a method for manufacturing a wiring substrate.

BACKGROUND

Japanese Laid-Open Patent Publication No. 2012-191204 discloses a wiring substrate that incorporates an electronic component such as a semiconductor chip or a chip capacitor. The wiring substrate includes an interlayer insulation layer having an opening, and the electronic component is arranged in the opening. Such a wiring substrate may be manufactured, for example, as follows.

First, a support substrate is prepared, and a wiring layer is formed on the support substrate. Then, a desired number of build-up wiring layers and interlayer insulation layers are stacked. Laser cutting is performed to form an opening in given ones of the interlayer insulation layers. After the electronic component is placed in the opening, an insulation layer fills the opening and entirely covers the electronic component. Then, a wiring layer is formed on the insulation layer and is electrically connected to the electronic component. Finally, the support substrate is removed.

SUMMARY

In a wiring substrate, electrical resistance may be increased in a portion that connects a via wiring and a build-up wiring layer. In this case, the reliability of electrical connection between the via wiring and the build-up wiring layer may be lowered.

An embodiment is a wiring substrate that includes a first metal plate. The first metal plate includes a first electrode and a wiring, and the wiring includes a mount portion for an electronic component. The wiring substrate further includes a second metal plate. The second metal plate includes a second electrode diffusion-bonded to an upper surface of the first electrode. The second metal plate includes a first opening that exposes the mount portion. The first opening is large enough to accommodate the electronic component.

BRIEF DESCRIPTION OF THE DRAWINGS

The embodiments, together with objects and advantages thereof, may best be understood by reference to the following description of the presently preferred embodiments together with the accompanying drawings in which:

FIG. 9 is a schematic cross-sectional view of the first metal plate in a separate region taken along line 9-9 in FIG. 8;

FIGS. 10A, 10B, and 10C are schematic cross-sectional views illustrating manufacturing steps of the first metal plate illustrated in FIGS. 8 and 9;

DESCRIPTION OF THE EMBODIMENTS

Figure 1:
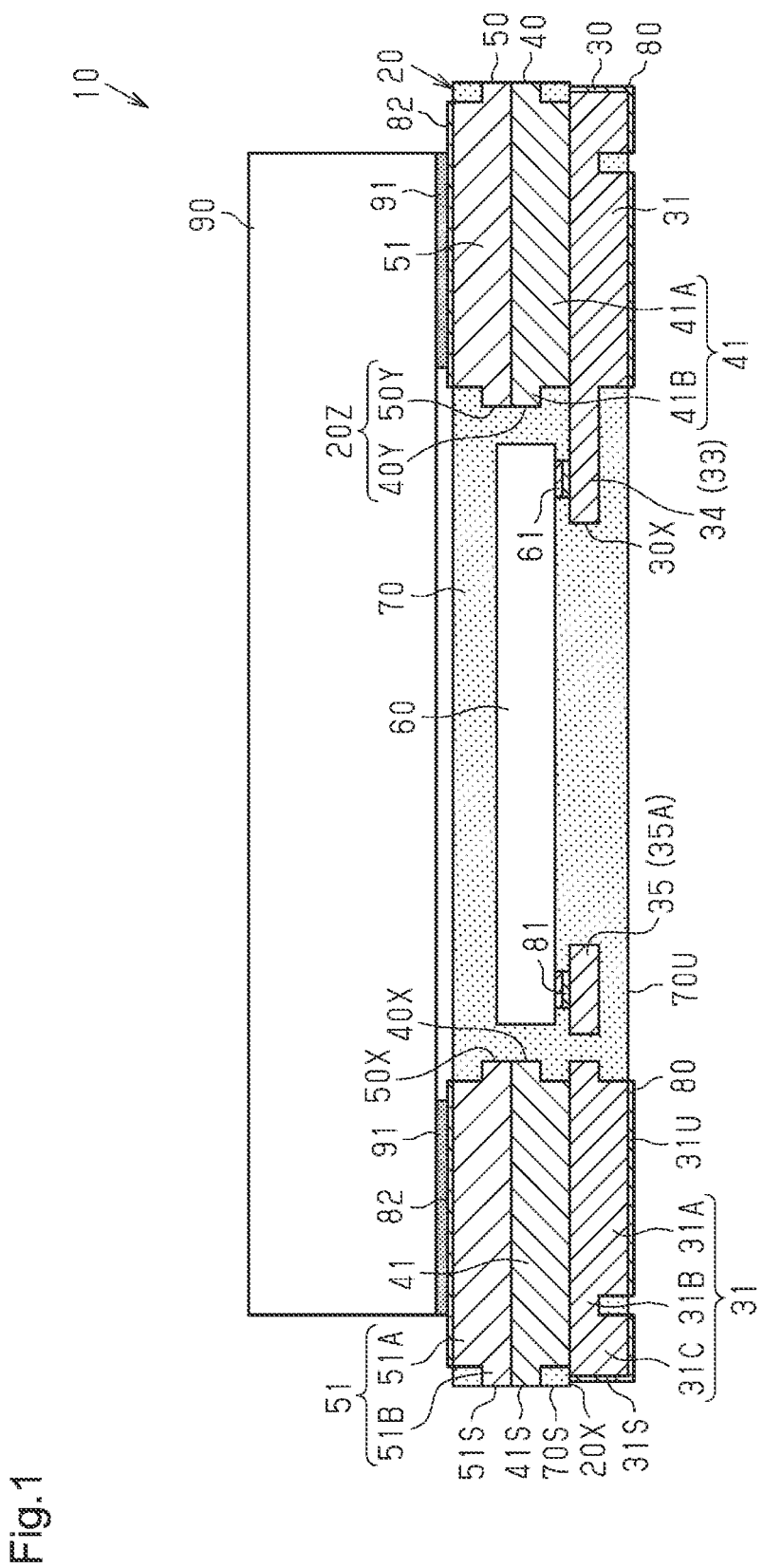
FIG. 1 is a schematic cross-sectional view illustrating an electronic device including an embodiment of a wiring substrate taken along line 1-1 in FIGS. 3 to 6.

An embodiment will be described below with reference to the accompanying drawings.

Elements in the drawings may be partially enlarged for simplicity and clarity and thus have not necessarily been drawn to scale. To facilitate understanding, hatching lines may not be illustrated or be replaced by shadings in the cross-sectional drawings.

Schematic Structure of Electronic Device 10

The structure of an electronic device 10 will now be described with reference to FIGS. 1 to 6.

As illustrated in FIG. 1, the electronic device 10 includes a wiring substrate 20 and one or more electronic components 90 mounted on the wiring substrate 20.

Figure 2:
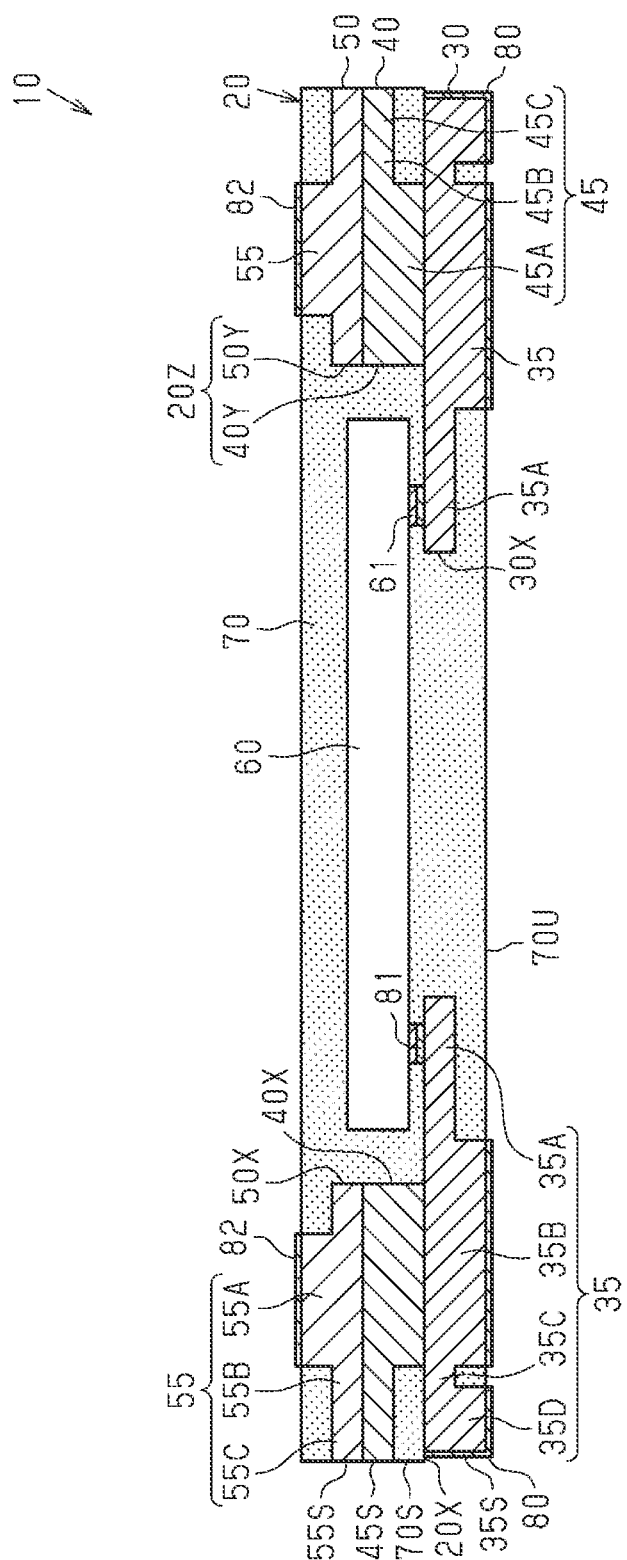
FIG. 2 is a schematic cross-sectional view of the electronic device illustrated in FIG. 1 taken along line 2-2 in FIGS. 3 to 6.

As illustrated in FIGS. 1 and 2, the wiring substrate 20 includes, for example, a metal plate 30, a metal plate 40 diffusion-bonded to an upper surface of the metal plate 30, and a metal plate 50 diffusion-bonded to an upper surface of the metal plate 40. The wiring substrate 20 includes one or more (here, one) electronic components 60 mounted on the upper surface of the metal plate 30 and an insulation layer 70 formed in the space among the metal plates 30, 40, and 50 and covering the electronic component 60. That is, the wiring substrate 20 is a wiring substrate that incorporates the electronic component 60. FIG. 1 illustrates a cross-sectional structure of the electronic device 10 in the cross section taken along line 1-1 in FIGS. 3 to 6. FIG. 2 illustrates a cross-sectional structure of the electronic device 10 in the cross section taken along line 2-2 in FIGS. 3 to 6. FIG. 2 does not illustrate the electronic component 90.

Schematic Structure of Wiring Substrate 20

The wiring substrate 20 is, for example, rectangular-box-shaped. In the present example, the wiring substrate 20 has a rectangular planar shape. The dimensions of the wiring substrate 20 may be, for example, approximately 4 mm×4 mm to 10 mm×10 mm in plan view. The thickness of the wiring substrate 20 may be, for example, approximately 0.4 mm to 1.1 mm. In this specification, "plan view" refers to a view of a subject taken in a normal direction (vertical direction in FIG. 1) of the upper surface of the metal plate 50, and "planar shape" refers to a shape of a subject taken in the normal direction of the upper surface of the metal plate 50.

The material of the metal plates 30, 40, and 50 may be, for example, copper (Cu) or a Cu alloy. The material of the metal plates 30, 40, and 50 may be, for example, an iron-nickel (Fe—Ni) alloy such as Alloy 42. The metal plates 30, 40, and 50 may be formed from the same material or different materials. The thickness of the metal plate 30 may be, for example, approximately 0.1 mm to 0.3 mm. The thickness of the metal plate 40 may be, for example, approximately 0.2 mm to 0.5 mm. The thickness of the metal plate 50 may be, for example, approximately 0.1 mm to 0.3 mm. The metal plates 30, 40, and 50 may be set to have the same thickness or different thicknesses.

The material of the insulation layer 70 may be, for example, an insulative resin such as polyimide resin and epoxy resin or a resin material obtained by mixing the resin with a filler such as silica and alumina. The thickness of the insulation layer 70 from the lower surface to the upper surface of the insulation layer 70 may be, for example, approximately 0.4 mm to 1.1 mm Structure of Metal Plate 30

The structure of the metal plate 30 will now be described with reference to FIGS. 1 to 4.

Figure 3:
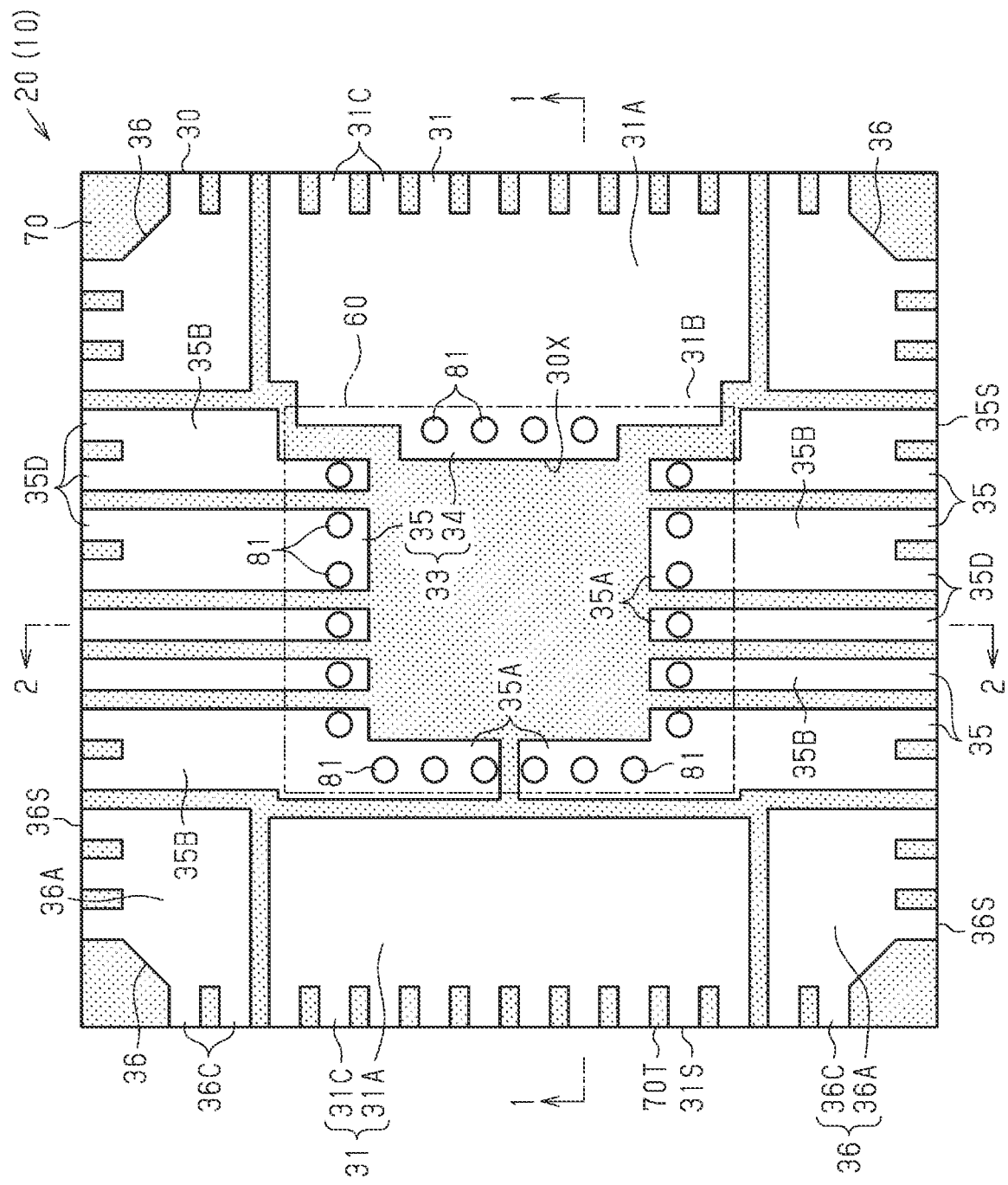
FIGS. 3, 4, 5, and 6 are schematic plan views of the wiring substrate illustrated in FIG. 1.
Figure 4:
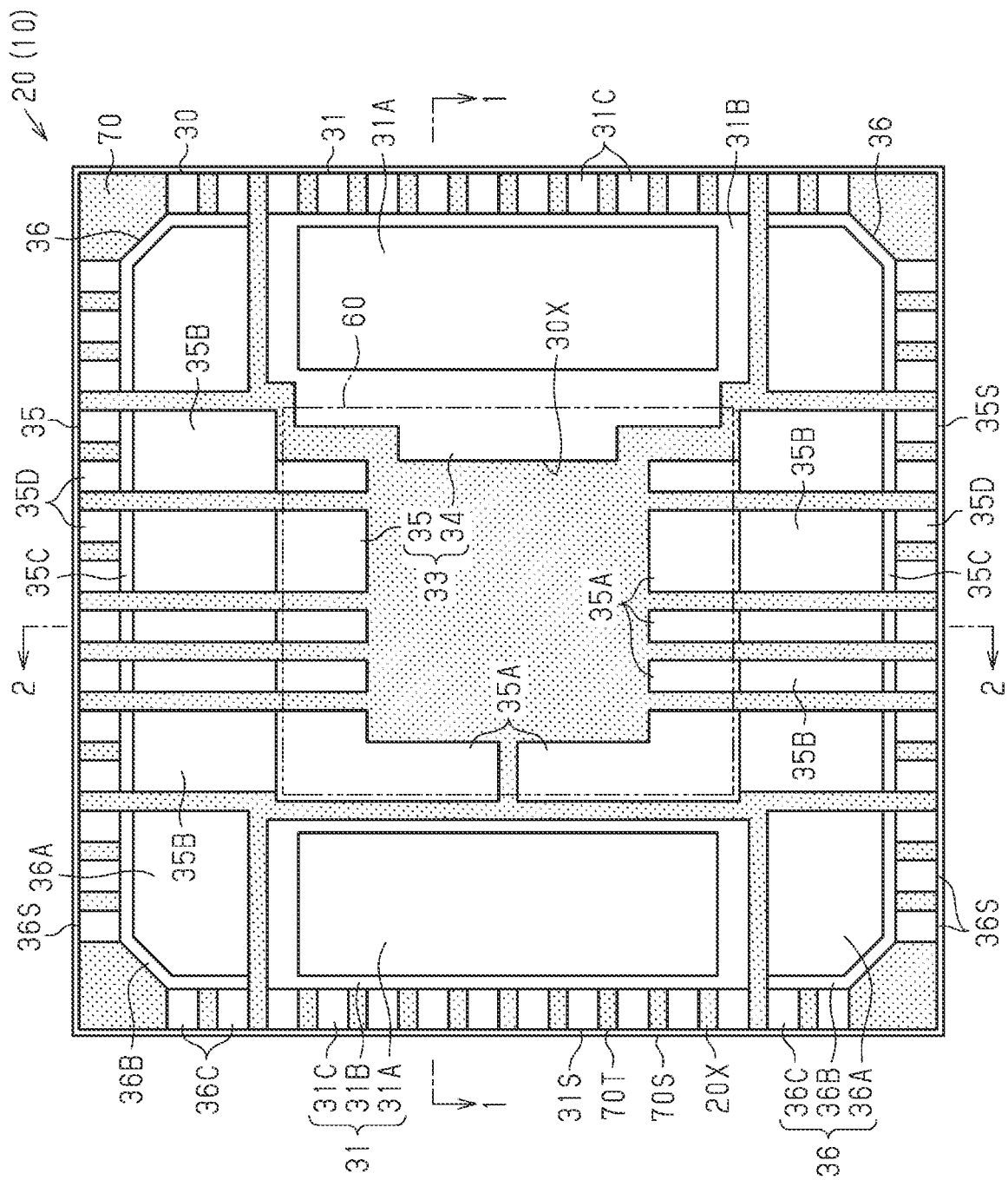

As illustrated in FIGS. 3 and 4, the metal plate 30 includes electrodes 31, wirings 33, and wirings 36. The electrodes 31, the wirings 33, and the wirings 36 are, for example, coplanar with each other. An opening 30X extends through the metal plate 30 in the thickness-wise direction of the metal plate 30 and defines the electrodes 31, the wirings 33, and the wirings 36. FIG. 3 is a plan view of the metal plate 30 and the insulation layer 70 taken from above. FIG. 4 is a plan view of the metal plate 30 and the insulation layer 70 taken from below.

Structure of Electrode 31

The electrodes 31 are spaced apart from each other. The electrodes 31 are, for example, arranged in a peripheral region of the wiring substrate 20 (electronic device 10). The electrodes 31 are, for example, arranged along two facing sides of the four sides defining the contour of the wiring substrate 20. The electrodes 31 face each other in a direction (sideward direction in FIG. 3) in which the two facing sides are arranged.

As illustrated in FIG. 4, each electrode 31 includes, for example, a body 31A, a projection 31B, and projections 31C. In the electrode 31, for example, the body 31A, the projection 31B, and the projections 31C are formed continuously and integrally with each other.

The body 31A is, for example, rectangular-box-shaped. The body 31A is, for example, solid. The body 31A has, for example, a given width extending along a side of the contour of the wiring substrate 20 and solidly extends from a peripheral edge of the wiring substrate 20 toward an inner side of the wiring substrate 20. The widthwise dimension of the body 31A may be set to, for example, 0.3 to 0.7 times each side of the contour of the wiring substrate 20. In this specification, "widthwise dimension" of each member refers to a dimension extending in a peripheral direction of the wiring substrate 20 (electronic device 10), that is, a direction extending around outer side surfaces of the wiring substrate 20 (electronic device 10).

The projection 31B projects, for example, outward from side surfaces of the body 31A. The projection 31B projects, for example, from a side surface of the body 31A toward the inner side of the wiring substrate 20. The projection 31B projects, for example, from side surfaces of the body 31A in the peripheral direction of the wiring substrate 20. The projection 31B projects, for example, from a side surface of the body 31A toward the peripheral edge of the wiring substrate 20.

As illustrated in FIG. 1, the projection 31B is, for example, thinner than the body 31A. The thickness of the projection 31B may be set to, for example, approximately 0.3 to 0.7 times the thickness of the body 31A. The projection 31B is recessed from the lower surface of the body 31A toward the metal plate 40. That is, the upper surface of the projection 31B is substantially flush with the upper surface of the body 31A, and the lower surface of the projection 31B is located at a higher position than the lower surface of the body 31A. The lower surface of the projection 31B is covered by the insulation layer 70.

As illustrated in FIG. 4, the projections 31C are, for example, branched from one of the side surfaces of the projection 31B that is located toward the peripheral edge of the wiring substrate 20. The projections 31C are, for example, arranged at given intervals along the peripheral edge of the wiring substrate 20. In the present example, ten projections 31C are arranged at given intervals along a side of the contour of the wiring substrate 20. Each projection 31C projects toward a peripheral edge of the wiring substrate 20 from a side surface of the projection 31B located toward the peripheral edge of the wiring substrate 20. The widthwise dimension of the projection 31C is, for example, set to be less than the widthwise dimension of the body 31A. As illustrated in FIG. 1, the thickness of the projection 31C is, for example, the same as the thickness of the body 31A. Therefore, the projection 31B, which is formed between the body 31A and the projections 31C, is groove-shaped.

The electrode 31 has an outer surface 31S, that is, an outer surface 31S of each projection 31C located toward the peripheral edge of the wiring substrate 20. The outer surface 31S is, for example, exposed from an outer surface 70S of the insulation layer 70. The outer surface 31S of the electrode 31 is, for example, located at a position recessed from the outer surface 70S of the insulation layer 70 toward the inner side of the wiring substrate 20. Therefore, the outer surface 70S of the insulation layer 70 and the outer surface 31S of the electrode 31 form a step 20X in the outer surface of the wiring substrate 20.

As illustrated in FIG. 4, the step 20X, for example, continuously extends around the entire perimeter in the peripheral direction of the wiring substrate 20. That is, the insulation layer 70 includes an outer surface 70T that covers the side surfaces excluding the outer surface 31S of the electrode 31. The outer surface 70T is located at a position recessed from the outer surface 70S of the insulation layer 70 toward the inner side of the wiring substrate 20. The outer surface 70T of the insulation layer 70 is, for example, substantially flush with the outer surface 31S of the electrode 31.

As illustrated in FIG. 1, the electrodes 31 includes a lower surface 31U, namely, a lower surface 31U of the body 31A and the projections 31C. The lower surface 31U is exposed from a lower surface 70U of the insulation layer 70. The lower surface 31U of the electrode 31 is, for example, substantially flush with the lower surface 70U of the insulation layer 70.

A metal layer 80 is formed on the outer surface 31S and the lower surface 31U of the electrode 31 exposed from the insulation layer 70. The metal layer 80, for example, covers the entire outer surface 31S and the entire lower surface 31U of the electrode 31. The metal layer 80, for example, continuously covers the outer surface 31S and the lower surface 31U of the electrode 31. The metal layer 80, for example, has a side surface located at a position recessed from the outer surface 70S of the insulation layer 70 toward the inner side of the wiring substrate 20. Examples of the metal layer 80 include a gold (Au) layer, a nickel (Ni) layer/Au layer (metal layer formed by stacking the Ni layer and the Au layer in this order), a Ni layer/palladium (Pd) layer/Au layer (metal layer formed by stacking the Ni layer, the Pd layer, and the Au layer in this order), and a Ni layer/silver (Ag) layer (metal layer formed by stacking the Ni layer and the Ag layer in this order). The Au layer is a metal layer formed of Au or an Au alloy. The Ni layer is a metal layer formed of Ni or a Ni alloy. The Pd layer is a metal layer formed of Pd or a Pd alloy. The Ag layer is a metal layer formed of Ag or a Ag alloy. Each of the Au layer, the Ni layer, the Pd layer, and the Ag layer may be, for example, a metal layer (electrolytic plated metal layer) formed through an electrolytic plating process. Instead of using the metal layer 80, for example, an anti-oxidation process such as an organic solderability preservative (OSP) process may be performed on the outer surface 31S and the lower surface 31U of the electrode 31 to form an OSP film. The OSP film may be a coating of an organic compound such as an azole compound or an imidazole compound.

Structure of Wiring 33

As illustrated in FIG. 3, the wirings 33 are arranged in a mount region of the electronic component 60. In the present example, the mount region of the electronic component 60 is located toward the inner side of the wiring substrate 20 from the electrodes 31. The wirings 33 include a wiring 34 formed integrally with the electrode 31 and wirings 35 separated from the electrode 31.

The wiring 34 is, for example, formed integrally with one or more of the electrodes 31. The wiring 34, for example, projects from one or more of the electrodes 31 toward the inner side of the wiring substrate 20. The wiring 34, for example, projects from the projection 31B of one or more of the electrodes 31 toward the inner side of the wiring substrate 20. The wiring 34, for example, has a given width extending along a side of the contour of the wiring substrate 20 and extends from the electrode 31 toward the inner side of the wiring substrate 20. For example, the entire wiring 34 is arranged in the mount region of the electronic component 60. In the present example, the entire wiring 34 is used as a mount portion.

As illustrated in FIG. 1, the thickness of the wiring 34 is, for example, the same as the thickness of the projection 31B of the electrodes 31. The thickness of the wiring 34 is, for example, less than the thickness of the body 31A of the electrode 31. The thickness of the wiring 34 may be set to, for example, approximately 0.3 to 0.7 times the thickness of the body 31A. The wiring 34 is recessed from the lower surface of the body 31A toward the metal plate 40. The lower surface of the wiring 34 is covered by the insulation layer 70.

As illustrated in FIG. 4, the wirings 35 are spaced apart from each other. The wirings 35 are, for example, arranged in a peripheral region of the mount region of the electronic component 60. The wirings 35 are, for example, arranged at given intervals along a peripheral edge of the mount region of the electronic component 60. The wirings 35, for example, cooperate with the wiring 34 to surround the peripheral edge of the mount region of the electronic component 60.

Each wiring 35 includes, for example, a mount portion 35A arranged in the mount region of the electronic component 60, a connector 35B connected to the mount portion 35A, a projection 35C connected to the connector 35B, and a projection 35D connected to the projection 35C. In the wiring 35, for example, the mount portion 35A, the connector 35B, the projection 35C, and the projection 35D are formed continuously and integrally with each other. The connector 35B, for example, connects the mount portion 35A to the projections 35C and 35D.

The connector 35B is, for example, rectangular-box-shaped. The connector 35B has, for example, a band-shaped planar shape. The connector 35B has, for example, a given width and extends from the peripheral edge toward the inner side of the wiring substrate 20. The widthwise dimension of the connector 35B is, for example, set to be less than the widthwise dimension of the body 31A of the electrode 31. The thickness of the connector 35B is, for example, the same as the thickness of the body 31A.

The mount portion 35A, for example, projects toward the inner side of the wiring substrate 20 from one of the side surfaces of the connector 35B located toward the inner side of the wiring substrate 20. The mount portion 35A has, for example, a band-shaped planar shape. The mount portion 35A has a given width and extends from the connector 35B toward the inner side of the wiring substrate 20.

As illustrated in FIG. 2, the mount portion 35A is, for example, thinner than the connector 35B. The thickness of the mount portion 35A may be set to, for example, approximately 0.3 to 0.7 times the thickness of the connector 35B. The mount portion 35A is recessed from the lower surface of the connector 35B toward the metal plate 40. The lower surface of the mount portion 35A is, for example, covered by the insulation layer 70.

The projection 35C projects, for example, from the side surface of the connector 35B toward the peripheral edge of the wiring substrate 20. The thickness of the projection 35C is, for example, the same as the thickness of the mount portion 35A. The thickness of the projection 35C is, for example, less than the thickness of the connector 35B. The projection 35C is recessed from the lower surface of the connector 35B toward the metal plate 40. The lower surface of the projection 35C is covered by the insulation layer 70.

As illustrated in FIG. 4, the projection 35D projects, for example, from the side surface of the projection 35C toward the peripheral edge of the wiring substrate 20. In the wiring 35, for example, one connector 35B (projection 35C) is provided with one or more projections 35D. The widthwise dimension of the projection 35D is, for example, set to be the same as the widthwise dimension of the projection 31C.

As illustrated in FIG. 2, the thickness of the projection 35D is, for example, the same as the thickness of the connector 35B. Therefore, the projection 35C, which is formed between the connector 35B and the projection 35D, is groove-shaped.

The wiring 35 has an outer surface 35S, that is, an outer surface 35S of the projection 35D located toward the peripheral edge of the wiring substrate 20. The outer surface 35S is, for example, exposed from the outer surface 70S of the insulation layer 70. The outer surface 35S of the wiring 35 is, for example, located at a position recessed from the outer surface 70S of the insulation layer 70 toward the inner side of the wiring substrate 20.

The wirings 34 and 35 illustrated in FIG. 3 are, for example, wirings used for mounting the electronic component 60. Metal layers 81 are formed on the upper surface of the wiring 34 and the upper surface of the mount portion 35A of each wiring 35. The metal layers 81 are, for example, arranged along peripheral edges of the electronic component 60. Each metal layer 81 is, for example, partially arranged on the upper surface of the wiring 34 or the upper surface of the mount portion 35A. The metal layer 81 is, for example, circular in plan view. As illustrated in FIG. 2, each metal layer 81 corresponds to a bump 61 of the electronic component 60. That is, the metal layer 81 is located at a position corresponding to the bump 61 of the electronic component 60 when the electronic component 60 is mounted on the metal plate 30. The metal layer 81 may be a Au layer, a Ni layer/Au layer, a Ni layer/Pd layer/Au layer, or a Ni layer/Ag layer.

The lower surface of the wiring 35, namely, the lower surface of the connector 35B and the projections 35D, is exposed from the lower surface 70U of the insulation layer 70. The lower surface of the wiring 35 is, for example, substantially flush with the lower surface 70U of the insulation layer 70. The metal layer 80 is, for example, arranged on the lower surface of the wiring 35. The metal layer 80, for example, covers the entire lower surface of the wiring 35.

Structure of Wiring 36

As illustrated in FIGS. 3 and 4, the wirings 36 are, for example, arranged in corners of the wiring substrate 20. The wirings 36 are, for example, arranged in four corners (four angles) of the wiring substrate 20. Each wiring 36 is, for example, spaced apart from the electrodes 31 and the wirings 34 and 35.

As illustrated in FIG. 4, each wiring 36 includes, for example, a body 36A, a projection 36B, and projections 36C. In the wiring 36, for example, the body 36A, the projection 36B, and the projections 36C are formed continuously with each other.

The body 36A has, for example, a polygonal planar shape. The thickness of the body 36A is, for example, the same as the thickness of the body 31A.

The projection 36B projects, for example, from side surfaces of the body 36A toward the peripheral edges of the wiring substrate 20. The thickness of the projection 36B is, for example, the same as the thickness of the projection 31B. The thickness of the projection 36B is, for example, less than the thickness of the body 36A. The projection 36B is recessed from the lower surface toward the upper surface of the body 36A. The lower surface of the projection 36B is, for example, covered by the insulation layer 70.

The projections 36C are, for example, branched from the side surfaces of the projection 36B located toward the peripheral edges of the wiring substrate 20. The projections 36C are, for example, arranged at given intervals along the peripheral edges of the wiring substrate 20. Each projection 36C projects toward a peripheral edge of the wiring substrate 20 from a side surface of the body 36A that is located toward the peripheral edge of the wiring substrate 20.

The widthwise dimension of the projection 36C is, for example, set to be the same as the widthwise dimension of the projection 31C. The thickness of the projection 36C is, for example, the same as the thickness of the body 36A. Therefore, the projection 36B, which is formed between the body 36A and the projections 36C, is groove-shaped.

The wiring 36 has an outer surface 36S, that is, an outer surface 36S of each projection 36C located toward the peripheral edge of the wiring substrate 20. The outer surface 36S is, for example, exposed from the outer surface 70S of the insulation layer 70. The outer surface 36S of the wiring 36 is, for example, located at a position recessed from the outer surface 70S of the insulation layer 70 toward the inner side of the wiring substrate 20.

The lower surface of the wiring 36, namely, the lower surface of the body 36A and the projections 36C, is exposed from the insulation layer 70. The lower surface of the wiring 36 is, for example, substantially flush with the lower surface 70U of the insulation layer 70 (refer to FIG. 1). The metal layer 80 (refer to FIG. 1) is, for example, arranged on the lower surface of the wiring 36.

Structure of Metal Plate 40

The structure of the metal plate 40 will now be described.

As illustrated in FIGS. 1 and 2, the lower surface of the metal plate 40 is joined to the upper surface of the metal plate 30 by diffusion bonding. Thus, the metal plate 40 is electrically connected to the metal plate 30. Diffusion bonding is a technique that applies heat and pressure to metal materials arranged in close contact with each other in a vacuum or inert gas environment so that the metal materials are joined to each other at an atomic level by diffusion of atoms that occurs in the joined surfaces of the metal materials. The metal plate 30 and the metal plate 40 that are joined by diffusion bonding are integrated without a boundary surface (i.e., with no gap), and the upper surface of the metal plate 30 is directly joined to the lower surface of the metal plate 40. In the drawings of the present embodiment, the metal plate 30 and the metal plate 40 are separated by solid lines to facilitate recognition of the metal plate 30 and the metal plate 40. However, actual boundary surfaces of the metal plate 30 and the metal plate 40 may have disappeared and may be unclear.

The metal plate 40 includes an opening 40Y that exposes the mount region of the electronic component 60. The opening 40Y exposes, for example, the metal plate 30 located in the mount region of the electronic component 60, namely, the wiring 34 and the mount portions 35A of the wirings 35. The opening 40Y is large enough to accommodate the electronic component 60.

Figure 5:
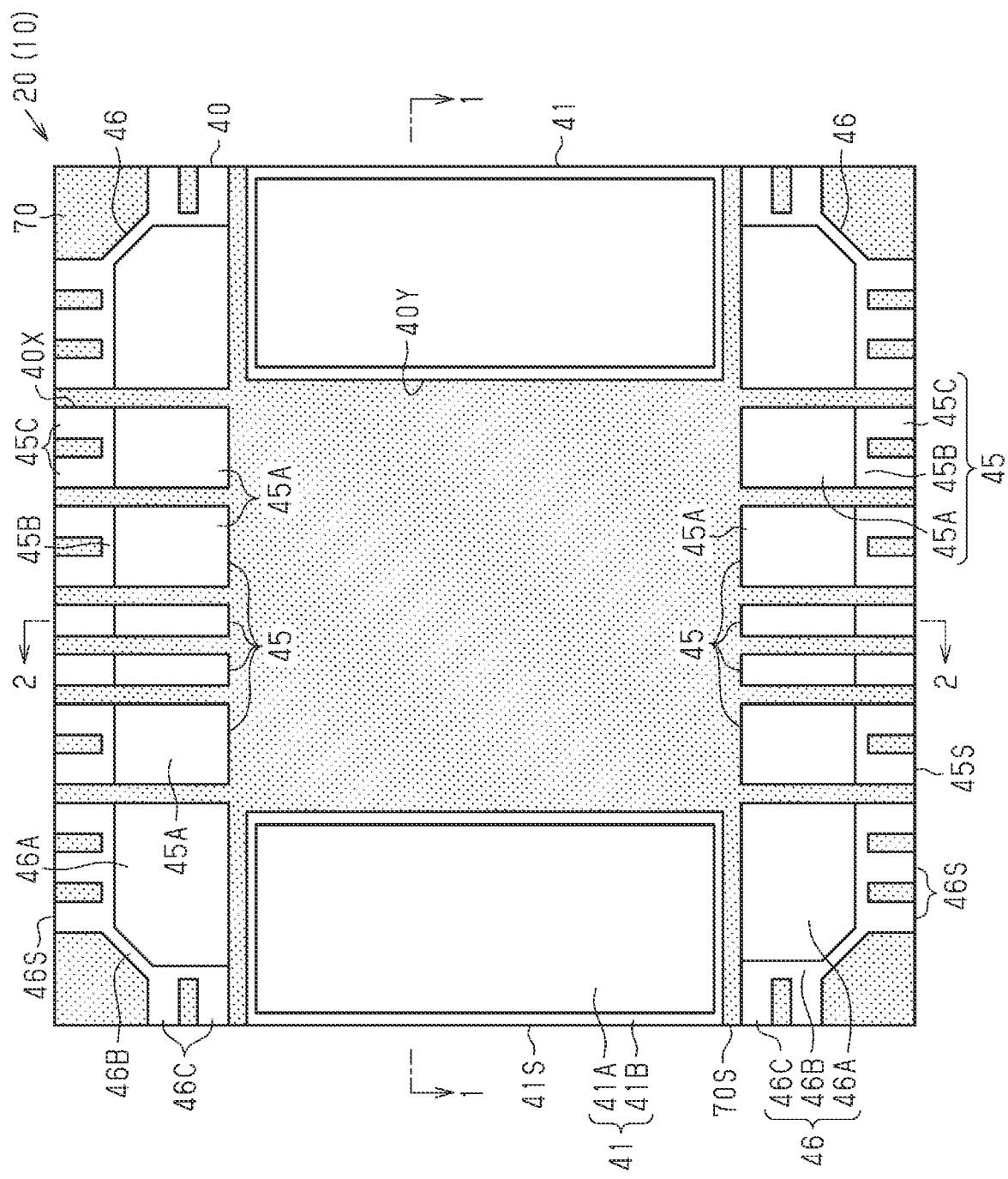

As illustrated in FIG. 5, the metal plate 40 includes, for example, electrodes 41, wirings 45, and wirings 46. The electrodes 41, the wirings 45, and the wirings 46 are, for example, coplanar with each other. An opening 40X extends through the metal plate 40 in the thickness-wise direction of the metal plate 40 and define the electrodes 41, the wirings 45, and the wirings 46. The opening 40X includes the opening 40Y. FIG. 5 is a plan view of the metal plate 40 and the insulation layer 70 taken from below.

Structure of Electrode 41

The electrodes 41 are spaced apart from each other. The electrodes 41 are arranged in the peripheral region of the wiring substrate 20. The electrodes 41 are, for example, arranged along two facing sides of the four sides defining the contour of the wiring substrate 20. The electrodes 41 face each other in a direction (sideward direction in FIG. 5) in which the two facing sides are arranged.

Each electrode 41 includes, for example, a body 41A and a projection 41B. In the electrode 41, the body 41A and the projection 41B are formed continuously and integrally with each other.

The body 41A is, for example, rectangular-box-shaped. The body 41A is, for example, solid. The body 41A has, for example, a given width extending along a side of the contour of the wiring substrate 20 and solidly extends from a peripheral edge of the wiring substrate 20 toward the inner side of the wiring substrate 20. The widthwise dimension of the body 41A may be set to, for example, 0.3 to 0.7 times each side of the contour of the wiring substrate 20.

The projection 41B projects, for example, outward from side surfaces of the body 41A. The projection 41B projects, for example, from a side surface of the body 41A toward the inner side of the wiring substrate 20. The projection 41B projects, for example, from side surfaces of the body 41A in the peripheral direction of the wiring substrate 20. The projection 41B projects, for example, from a side surface of the body 41A toward the peripheral edge of the wiring substrate 20.

As illustrated in FIG. 1, the projection 41B is, for example, thinner than the body 41A. The thickness of the projection 41B may be set to, for example, approximately 0.3 to 0.7 times the thickness of the body 41A. The projection 41B is recessed from the lower surface of the body 41A toward the metal plate 50. That is, the upper surface of the projection 41B is substantially flush with the upper surface of the body 41A, and the lower surface of the projection 41B is located at a higher position than the lower surface of the body 41A. The lower surface of the projection 41B is, for example, covered by the insulation layer 70.

The electrode 41 is arranged at a position overlapping the electrode 31 in plan view. The lower surface of the electrode 41 is joined to the upper surface of the electrode 31 by diffusion bonding. For example, the lower surface of the body 41A is joined to the upper surface of the electrode 31 by diffusion bonding. In this case, the body 41A overlaps, for example, the body 31A and part of the projections 31B and 31C in plan view. The projection 41B overlaps, for example, part of the projections 31B and 31C in plan view. The electrode 41 exposes the metal plate 30 located in the mount region of the electronic component 60 (i.e., wiring 34 and mount portions 35A of wirings 35). The side surface of the electrode 41 that is located toward the inner side of the wiring substrate 20 defines a wall surface of the opening 40Y in the metal plate 40.

The electrode 41 has an outer surface 41S, that is, an outer surface 41S of the projection 41B located toward the peripheral edge of the wiring substrate 20. The outer surface 41S is exposed from the outer surface 70S of the insulation layer 70. The outer surface 41S of the electrode 41 is, for example, substantially flush with the outer surface 70S of the insulation layer 70. In this case, the outer surface 41S of the electrode 41 (projection 41B) exposed from the insulation layer 70 has a smaller area than a side surface of the body 41A. That is, in the present embodiment, the projection 41B is thinner than the body 41A, so that the area of the outer surface 41S exposed from the insulation layer 70 is smaller than the area of the side surface of the body 41A.

Structure of Wiring 45

As illustrated in FIG. 5, the wirings 45 are spaced apart from each other. The wirings 45 are arranged in the peripheral region of the wiring substrate 20. The wirings 45 are arranged at given intervals along the peripheral edges of the wiring substrate 20. In the present example, five wirings 45 are arranged at given intervals along each side of the counter of the wiring substrate 20 where the electrodes 41 are not arranged.

As illustrated in FIG. 2, each wiring 45 is arranged at a position overlapping part of the wiring 35 in plan view. The wiring 45 overlaps, for example, part of the wiring 35 located at an outer side of the mount region of the electronic component 60 (i.e., connector 35B and projections 35C and 35D) in plan view. The wiring 45 exposes the metal plate 30 located in the mount region of the electronic component 60. The wiring 45 is located at a position that does not overlap the wiring 34 (refer to FIG. 4) and the mount portion 35A of the wiring 35 in the wiring 33 in plan view. The side surface of the wiring 45 that is located toward the inner side of the wiring substrate 20 defines a wall surface of the opening 40Y in the metal plate 40.

As illustrated in FIG. 5, each wiring 45 includes, for example, a body 45A, a projection 45B, and a projection 45C. In the wiring 45, for example, the body 45A, the projection 45B, and the projection 45C are formed continuously with each other.

The body 45A is, for example, rectangular-box-shaped. The body 45A has, for example, a band-shaped planar shape. The body 45A has, for example, a given width and extends from the peripheral edge toward the inner side of the wiring substrate 20. The widthwise dimension of the body 45A is, for example, set to be less than the widthwise dimension of the body 41A of the electrode 41. The widthwise dimension of the body 45A is, for example, set to be the same as the widthwise dimension of the connector 35B (refer to FIG. 4). The thickness of the body 45A is, for example, the same as the thickness of the body 41A.

The projection 45B projects, for example, from a side surface of the body 45A toward the peripheral edge of the wiring substrate 20. The projection 45C projects, for example, toward a peripheral edge of the wiring substrate 20 from a side surface of the projection 31B that is located toward the peripheral edge of the wiring substrate 20. In the wiring 45, for example, one projection 45B is provided with one or more projections 45C. The widthwise dimension of the projection 45C is, for example, set to be the same as the widthwise dimension of the projection 35D (refer to FIG. 4).

As illustrated in FIG. 2, the projections 45B and 45C are, for example, thinner than the body 45A. The thickness of the projections 45B and 45C is, for example, the same as the thickness of the projection 41B (refer to FIG. 1). The projections 45B and 45C are recessed from the lower surface toward the upper surface of the body 45A. The lower surface of the projections 45B and 45C is, for example, covered by the insulation layer 70.

The lower surface of the wiring 45 is joined to the upper surface of the wiring 35 by diffusion bonding. For example, the lower surface of the body 45A is joined to the upper surface of the connector 35B by diffusion bonding. The body 45A overlaps part of the connector 35B in plan view. The projection 45B overlaps, for example, the projection 35C in plan view. The projection 45C overlaps, for example, the projection 35D in plan view. The projections 45B and 45C are, for example, arranged separately from the projections 35C and 35D in a stacking direction of the metal plates 30, 40, and 50 (vertical direction in the drawings).

The wiring 45 has an outer surface 45S, that is, an outer surface 45S of each projection 45C located toward the peripheral edge of the wiring substrate 20. The outer surface 45S is, for example, exposed from the outer surface 70S of the insulation layer 70. The outer surface 45S of the wiring 45 is, for example, substantially flush with the outer surface 70S of the insulation layer 70.

Structure of Wiring 46

As illustrated in FIG. 5, the wirings 46 are, for example, arranged in corners of the wiring substrate 20. The wirings 46 are, for example, arranged in four corners of the wiring substrate 20. The wirings 46 are, for example, spaced apart from the electrodes 41 and the wirings 45 and electrically insulated from the electrodes 41 and the wirings 45.

Each wiring 46 includes, for example, a body 46A, a projection 46B, and projections 46C. In the wiring 46, for example, the body 46A, the projection 46B, and the projections 46C are formed continuously with each other.

The body 46A has, for example, a polygonal planar shape. The planar shape of the body 46A is, for example, the same as the planar shape of the body 36A (refer to FIG. 4). The thickness of the body 46A is, for example, the same as the thickness of the body 41A.

The projection 46B projects, for example, from side surfaces of the body 46A toward the peripheral edges of the wiring substrate 20. The projections 46C are, for example, branched from the side surfaces of the projection 46B located toward the peripheral edges of the wiring substrate 20. The projections 46C are, for example, arranged at given intervals along the peripheral edges of the wiring substrate 20. Each projection 46C projects from a side surface of the projection 46B toward the peripheral edge of the wiring substrate 20. The widthwise dimension of the projection 46C is, for example, set to be the same as the widthwise dimension of the projection 45C.

The thickness of the projections 46B and 46C is, for example, less than the thickness of the body 46A. The thickness of the projections 46B and 46C is, for example, the same as the thickness of the projection 41B. The projections 46B and 46C are recessed from the lower surface toward the upper surface of the body 46A. The lower surface of the projections 46B and 46C is, for example, covered by the insulation layer 70.

The wiring 46 is arranged at a position overlapping the wiring 36 (refer to FIG. 4) in plan view. The lower surface of the wiring 46 is joined to the upper surface of the wiring 36 (refer to FIG. 3) by diffusion bonding. For example, the lower surface of the body 46A is joined to the upper surface of the body 36A (refer to FIG. 3) by diffusion bonding.

The wiring 46 has an outer surface 46S, that is, an outer surface 46S of each projection 46C located toward the peripheral edge of the wiring substrate 20. The outer surface 46S is, for example, exposed from the outer surface 70S of the insulation layer 70. The outer surface 46S of the wiring 46 is, for example, substantially flush with the outer surface 70S of the insulation layer 70.

Structure of Metal Plate 50

The structure of the metal plate 50 will now be described.

As illustrated in FIGS. 1 and 2, the lower surface of the metal plate 50 is joined to the upper surface of the metal plate 40 by diffusion bonding. Thus, the metal plate 50 is electrically connected to the metal plate 40. In the drawings of the present embodiment, the metal plate 40 and the metal plate 50 are separated by solid lines to facilitate recognition of the metal plate 40 and the metal plate 50. However, actual boundary surfaces of the metal plate 40 and the metal plate 50 may have disappeared and may be unclear.

The metal plate 50 includes an opening 50Y that exposes the mount region of the electronic component 60. The opening 50Y exposes, for example, the metal plate 30 located in the mount region of the electronic component 60, namely, the wiring 34 and the mount portions 35A of the wirings 35. The opening 50Y is large enough to accommodate the electronic component 60.

Figure 6:
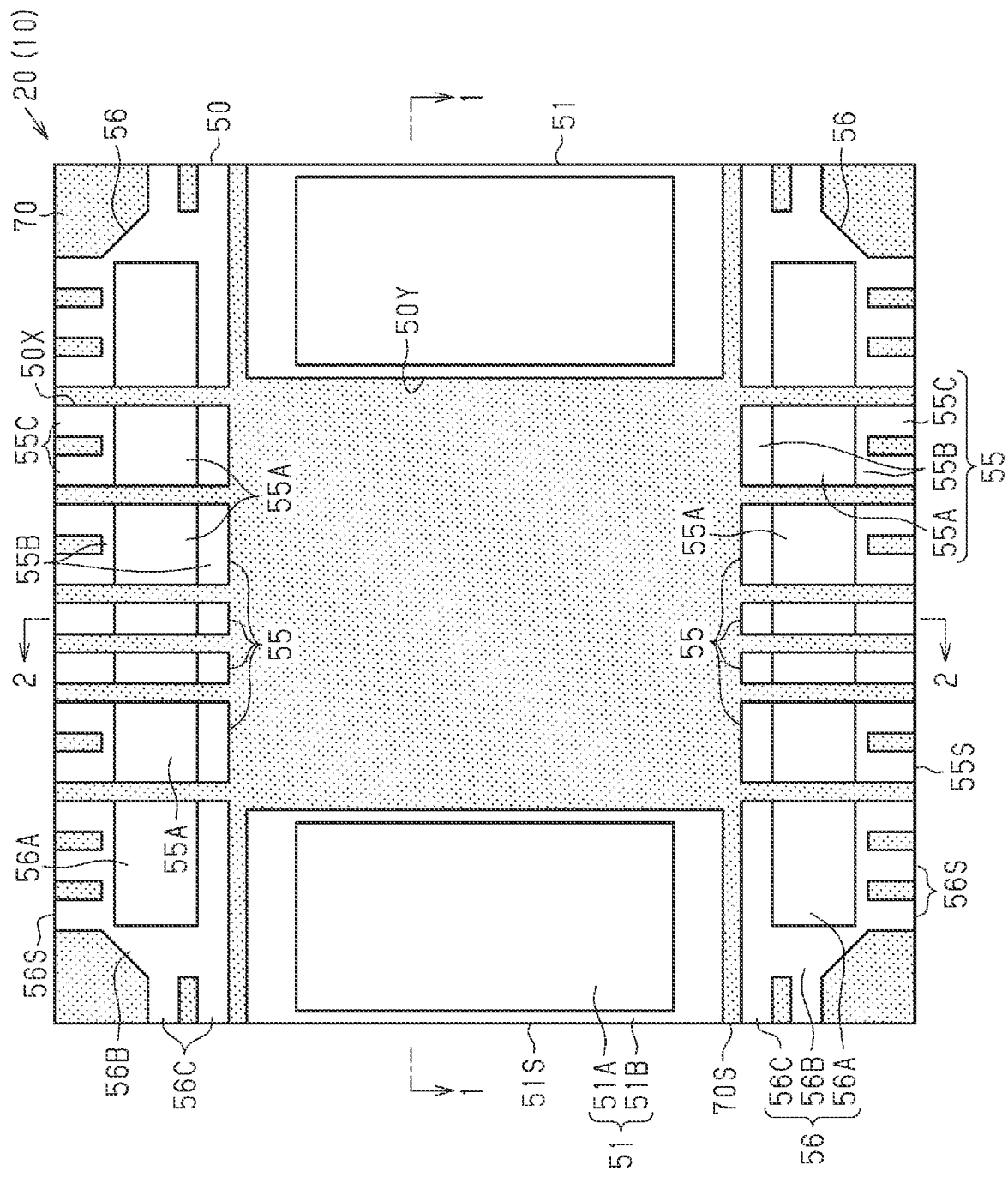

As illustrated in FIG. 6, the metal plate 50 includes, for example, electrodes 51, wirings 55, and wirings 56. The electrodes 51, the wirings 55, and the wirings 56 are, for example, coplanar with each other. An opening 50X extends through the metal plate 50 in the thickness-wise direction of the metal plate 50 and define the electrodes 51, the wirings 55, and the wirings 56. The opening 50X includes the opening 50Y. FIG. 6 is a plan view of the metal plate 50 and the insulation layer 70 taken from above.

Structure of Electrode 51

The electrodes 51 are spaced apart from each other. The electrodes 51 are arranged in the peripheral region of the wiring substrate 20. The electrodes 51 are, for example, arranged along two facing sides of the four sides defining the contour of the wiring substrate 20. The electrodes 51 face each other in a direction (sideward direction in FIG. 6) in which the two facing sides are arranged.

Each electrode 51 includes, for example, a body 51A and a projection 51B. In the electrode 51, the body 51A and the projection 51B are formed continuously and integrally with each other.

The body 51A is, for example, rectangular-box-shaped. The body 51A is, for example, solid. The body 51A has, for example, a given width extending along a side of the contour of the wiring substrate 20 and solidly extends from a peripheral edge of the wiring substrate 20 toward the inner side of the wiring substrate 20. The widthwise dimension of the body 51A may be set to, for example, 0.3 to 0.7 times each side of the contour of the wiring substrate 20.

The projection 51B projects, for example, outward from side surfaces of the body 51A. The projection 51B projects, for example, from a side surface of the body 51A toward the inner side of the wiring substrate 20. The projection 51B projects, for example, from side surfaces of the body 51A in the peripheral direction of the wiring substrate 20. The projection 51B projects, for example, from a side surface of the body 51A toward the peripheral edge of the wiring substrate 20.

As illustrated in FIG. 1, the projection 51B is, for example, thinner than the body 51A. The thickness of the projection 51B may be set to, for example, approximately 0.3 to 0.7 times the thickness of the body 51A. The projection 51B is recessed from the upper surface of the body 51A toward the metal plate 40. That is, the lower surface of the projection 51B is substantially flush with the lower surface of the body 51A, and the upper surface of the projection 51B is located at a lower position than the upper surface of the body 51A. The upper surface of the projection 51B is, for example, covered by the insulation layer 70.

The electrode 51 is arranged at a position overlapping the electrodes 31 and 41 in plan view. The lower surface of the electrode 51 is joined to the upper surface of the electrode 41 by diffusion bonding. The lower surfaces of the body 51A and the projection 51B are joined to the upper surfaces of the body 41A and the projection 41B by diffusion bonding. In this case, the body 51A and the projection 51B overlap, for example, the body 31A of the electrode 31 and the electrode 41 in plan view. The electrode 51 exposes, for example, the metal plate 30 located in the mount region of the electronic component 60 (i.e., wiring 34 and mount portions 35A of wirings 35). That is, the side surface of the electrode 51 that is located toward the inner side of the wiring substrate 20 defines a wall surface of the opening 50Y in the metal plate 50.

The electrode 51 has an outer surface 51S, that is, an outer surface 51S of the projection 51B located toward the peripheral edge of the wiring substrate 20. The outer surface 51S is exposed from the outer surface 70S of the insulation layer 70. The outer surface 51S of the electrode 51 is, for example, substantially flush with the outer surface 70S of the insulation layer 70. In this case, the outer surface 51S of the electrode 51 (projection 51B) exposed from the insulation layer 70 has a smaller area than a side surface of the body 51A. That is, in the present embodiment, the projection 51B is thinner than the body 51A, so that the area of the outer surface 51S exposed from the insulation layer 70 is smaller than the area of the side surface of the body 51A.

The upper surface of the electrode 51, namely, the upper surface of the body 51A, is exposed from the insulation layer 70. The upper surface of the body 51A is, for example, substantially flush with the upper surface of the insulation layer 70. The upper surface of the electrode 51 exposed from the insulation layer 70 is used as an electrode pad connected to the electronic component 90. A metal layer 82 is formed on the upper surface of the electrode 51 exposed from the insulation layer 70. The metal layer 82 covers, for example, the entire upper surface of the body 51A. The metal layer 82 may be, for example, a Au layer, a Ni layer/Au layer, a Ni layer/Pd layer/Au layer, or a Ni layer/Ag layer. Instead of using the metal layer 82, for example, an anti-oxidation process such as an OSP process may be performed on the upper surface of the body 51A to form an OSP film.

Structure of Wiring 55

As illustrated in FIG. 6, the wirings 55 are spaced apart from each other. The wirings 55 are arranged in the peripheral region of the wiring substrate 20. The wirings 55 are arranged at given intervals along the peripheral edges of the wiring substrate 20. In the present example, five wirings 55 are arranged at given intervals along each side of the counter of the wiring substrate 20 where the electrodes 51 are not arranged.

As illustrated in FIG. 2, each wiring 55 is arranged at a position overlapping part of the wiring 35 in plan view. The wiring 55 overlaps, for example, part of the wiring 35 located at an outer side of the mount region of the electronic component 60 (i.e., connector 35B and projections 35C and 35D) in plan view. The wiring 55 exposes the metal plate 30 located in the mount region of the electronic component 60. The wiring 55 is located at a position that does not overlap the wiring 34 and the mount portion 35A of the wiring 35 of the wiring 33 in plan view. The side surface of the wiring 55 that is located toward the inner side of the wiring substrate 20 defines a wall surface of the opening 50Y in the metal plate 50.

As illustrated in FIG. 6, each wiring 55 includes, for example, a body 55A, a projection 55B, and a projection 55C. In the wiring 55, for example, the body 55A, the projection 55B, and the projection 55C are formed continuously with each other.

The body 55A is, for example, rectangular-box-shaped. The body 55A has, for example, a band-shaped planar shape. The body 55A has, for example, a given width and extends from the peripheral edge toward the inner side of the wiring substrate 20. The body 55A is, for example, smaller in planar shape than the body 45A (refer to FIG. 5). The widthwise dimension of the body 55A is, for example, set to be less than the widthwise dimension of the body 51A of the electrode 51. The widthwise dimension of the body 55A is, for example, set to be the same as the widthwise dimension of the connector 35B (refer to FIG. 4) and the body 45A (refer to FIG. 5). The thickness of the body 55A is, for example, the same as the thickness of the body 51A.

The projection 55B projects, for example, outward from side surfaces of the body 55A. The projection 55B projects, for example, from a side surface of the body 55A toward the inner side of the wiring substrate 20. The projection 55B projects, for example, from a side surface of the body 55A toward the peripheral edge of the wiring substrate 20.

The projection 55C projects, for example, toward a peripheral edge of the wiring substrate 20 from a side surface of the projection 55B that is located toward the peripheral edge of the wiring substrate 20. In the wiring 55, for example, one projection 55B is provided with one or more projections 55C. The widthwise dimension of the projection 55C is, for example, set to be less than the widthwise dimension of the body 51A. The widthwise dimension of the projection 55C is, for example, set to be the same as the widthwise dimension of the projection 35D (refer to FIG. 4).

As illustrated in FIG. 2, the projections 55B and 55C are, for example, thinner than the body 55A. The thickness of the projections 55B and 55C is, for example, the same as the thickness of the projection 51B (refer to FIG. 1). The projections 55B and 55C are recessed from the upper surface toward the lower surface of the body 55A. The upper surface of the projections 55B and 55C is, for example, covered by the insulation layer 70.

The lower surface of the wiring 55 is joined to the upper surface of the wiring 45 by diffusion bonding. For example, the entire lower surface of the wiring 55 is joined to the entire upper surface of the wiring 45.

The wiring 55 has an outer surface 55S, that is, an outer surface 55S of each projection 55C located toward the peripheral edge of the wiring substrate 20. The outer surface 55S is, for example, exposed from the outer surface 70S of the insulation layer 70. The outer surface 55S of the wiring 55 is, for example, substantially flush with the outer surface 70S of the insulation layer 70.

The upper surface of the wiring 55, namely, the upper surface of the body 55A, is exposed from the insulation layer 70. The upper surface of the body 55A is, for example, substantially flush with the insulation layer 70. For example, the metal layer 82 is arranged on the upper surface of the body 55A. The metal layer 82 covers, for example, the entire upper surface of the body 55A.

Structure of Wiring 56

As illustrated in FIG. 6, the wirings 56 are, for example, arranged in corners of the wiring substrate 20. The wirings 56 are, for example, arranged in four corners of the wiring substrate 20. The wirings 56 are, for example, spaced apart from the electrodes 51 and the wirings 55 and electrically insulated from the electrodes 51 and the wirings 55.

Each wiring 56 includes, for example, a body 56A, a projection 56B, and projections 56C. In the wiring 56, for example, the body 56A, the projection 56B, and the projections 56C are formed continuously with each other.

The body 56A has, for example, a rectangular planar shape. The body 56A is, for example, smaller in planar shape than the body 36A (refer to FIG. 4) and the body 46A (refer to FIG. 5). The thickness of the body 56A is, for example, the same as the thickness of the body 51A.

The projection 56B projects, for example, from side surfaces of the body 56A in the peripheral direction of the wiring substrate 20. The projection 56B projects, for example, from side surfaces of the body 56A toward the peripheral edges of the wiring substrate 20. The projections 56C are, for example, branched from the side surfaces of the projection 56B located toward the peripheral edges of the wiring substrate 20. The projections 56C are, for example, arranged at given intervals along the peripheral edges of the wiring substrate 20. Each projection 56C projects toward a peripheral edge of the wiring substrate 20 from a side surface of the projection 56B that is located toward the peripheral edge of the wiring substrate 20. The widthwise dimension of the projection 56C is, for example, set to be the same as the widthwise dimension of the projection 55C.

The thickness of the projections 56B and 56C is, for example, less than the thickness of the body 56A. The thickness of the projections 56B and 56C is, for example, the same as the thickness of the projection 51B. The projections 56B and 56C are recessed from the upper surface toward the lower surface of the body 56A. The upper surface of the projections 56B and 56C is, for example, covered by the insulation layer 70.

The wiring 56 is arranged at a position overlapping the wiring 46 (refer to FIG. 5) in plan view. The lower surface of the wiring 56 is joined to the upper surface of the wiring 46 (refer to FIG. 5) by diffusion bonding. For example, the entire lower surface of the wiring 56 is joined to the entire upper surface of the wiring 46 (refer to FIG. 5).

The wiring 56 has an outer surface 56S, that is, an outer surface 56S of each projection 56C located toward the peripheral edge of the wiring substrate 20. The outer surface 56S is, for example, exposed from the outer surface 70S of the insulation layer 70. The outer surface 56S of the wiring 56 is, for example, substantially flush with the outer surface 70S of the insulation layer 70.

The upper surface of the wiring 56, namely, the upper surface of the body 56A, is, for example, exposed from the insulation layer 70. The upper surface of the body 56A is, for example, substantially flush with the upper surface of the insulation layer 70. For example, the metal layer 82 (refer to FIG. 1) is arranged on the upper surface of the body 56A.

Structure of Metal Plates 30, 40, 50

As illustrated in FIGS. 1 and 2, in the wiring substrate 20, the metal plate 40 is joined to the upper surface of the metal plate 30 by diffusion bonding, and the metal plate 50 is joined to the upper surface of the metal plate 40 by diffusion bonding. The metal plates 40 and 50 respectively include the openings 40Y and 50Y that expose the metal plate 30 located in the mount region of the electronic component 60 (i.e., wiring 34 and mount portions 35A of wirings 35). In the wiring substrate 20, a cavity 20Z is formed by the openings 40Y and 50Y and the metal plate 30 exposed in the openings 40Y and 50Y to accommodate the electronic component 60. That is, the bottom surface of the cavity 20Z is formed by the wiring 34 and the mount portion 35A of the wiring 35. The side surfaces of the cavity 20Z are formed by the side wall surfaces of the openings 40Y and 50Y.

Structure of Electronic Component 60

As illustrated in FIG. 1, the electronic component 60 is accommodated in the cavity 20Z. The electronic component 60 is mounted on the upper surface of the metal plate 30. For example, the electronic component 60 is mounted on the upper surface of the wiring 34 and the upper surfaces of the mount portions 35A of the wirings 35.

The electronic component 60 may be, for example, an active component such as a semiconductor chip, a transistor, or a diode, or a passive component such as a chip capacitor, a chip inductor, or a chip resistor. The electronic component 60 may be, for example, a silicon component or a ceramic component. In the present embodiment, the electronic component 60 is a semiconductor chip. The semiconductor chip may be, for example, a logic chip such as a central processing unit (CPU) chip or a graphics processing unit (GPU) chip. The semiconductor chip may be, for example, a memory chip such as a dynamic random access memory (DRAM) chip, a static random access memory (SRAM) chip, or a flash memory chip.

In the present example, the electronic component 60 is flip-chip-mounted on the wirings 33. For example, the bumps 61 are arranged on terminals (not illustrated) formed on a circuit formation surface (here, lower surface) of the electronic component 60 and are joined to the metal layers 81 formed on the upper surface of the wirings 34 and 35. Thus, the terminals of the electronic component 60 are electrically connected to the wirings 34 and 35 by the bumps 61 and the metal layers 81.

Structure of Insulation Layer 70

As illustrated in FIGS. 1 and 2, the insulation layer 70 fills the spaces among the metal plate 30, the metal plate 40, and the metal plate 50 and the space between the electronic component 60 and the metal plates 30, 40, and 50. The insulation layer 70 fills, for example, the openings 30X, 40X, and 50X in the metal plates 30, 40, and 50. For example, the insulation layer 70 fills the space between the electrodes 31, the space between the wirings 33, the space between the wirings 36 (refer to FIG. 3), and the space among the electrodes 31, the wirings 33, and the wirings 36. The insulation layer 70 fills the space between the electrodes 41, the space between the wirings 45, the space between the wirings 46 (refer to FIG. 5), and the space among the electrodes 41, the wirings 45, the wirings 46. The insulation layer 70 fills the space between the electrodes 51, the space between the wirings 55, the space between the wirings 56 (refer to FIG. 6) and the space among the electrodes 51, the wirings 55, and the wirings 56. The insulation layer 70 covers, for example, the entirety of the electronic component 60.

As illustrated in FIG. 1, one or more (here, one) electronic components 90 are mounted on the upper surface of the metal plate 50. The electronic component 90 is mounted on, for example, the upper surfaces of the electrodes 51. The electronic component 90 may be, for example, a passive component such as a chip capacitor, a chip inductor, or a chip resistor or an active component such as semiconductor chip, a transistor, or a diode. The electronic component 90 may be, for example, a silicon component or a ceramic component. In the present embodiment, the electronic component 90 is a chip inductor.

The electronic component 90, for example, extends over the opening 50X formed between the electrodes 51 and is mounted on the upper surfaces of the two electrodes 51 located at opposite sides of the opening 50X. The electronic component 90 is mounted on, for example, the metal layer 82 formed on the upper surface of the electrodes 51. The electronic component 90 is, for example, joined to the metal layer 82 by a conductive joint material 91. For example, the electronic component 90 has terminals (not illustrated) joined to the metal layer 82 by the joint material 91. Thus, the terminals of the electronic component 90 are electrically connected to the electrodes 51 by the joint material 91 and the metal layer 82. The terminals of the electronic component 90 are, for example, electrically connected to the electronic component 60 by the electrodes 51, 41, and 31, the wiring 34, and the metal layer 81. The electronic component 90 overlaps, for example, part of the electronic component 60 in plan view.

The joint material 91 may be, for example, solder, a conductive paste such as a silver paste, or a brazing metal. Solder may be, for example, a lead-free solder. Examples of lead-free solder include a Sn—Ag base, a Sn—Cu base, a Sn—Ag—Cu base, or a Sn—Zn—Bi base solder.

Applicable Example of Electronic Device 10

Figure 7:
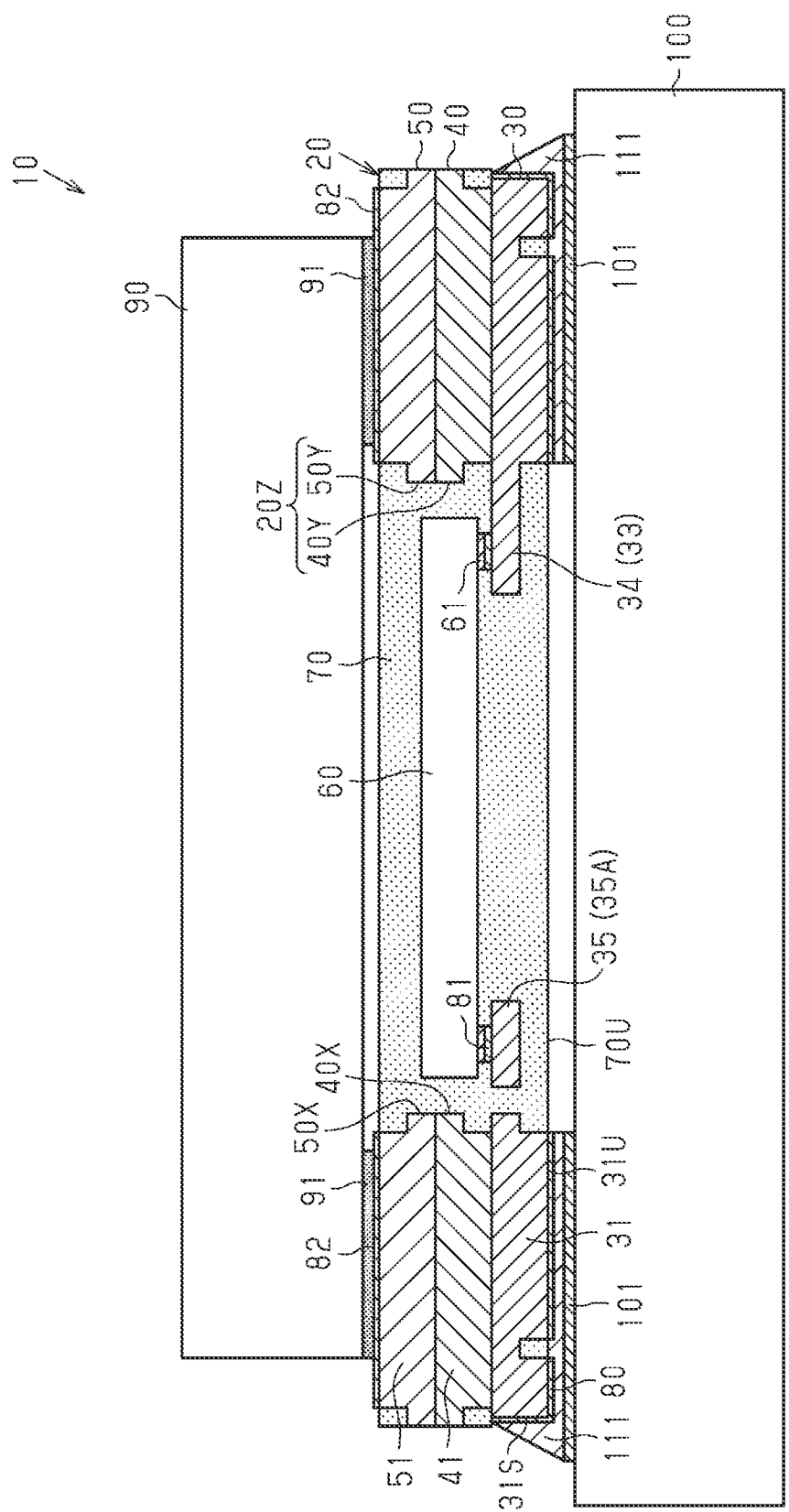
FIG. 7 is a schematic cross-sectional view of an applicable example of the electronic device illustrated in FIG. 1.

An example of a mode for mounting the electronic device 10 will now be described with reference to FIG. 7.

The electronic device 10 is, for example, mounted on a mounting wiring substrate 100 such as a motherboard. Wiring layers 101 are formed on an upper surface of the wiring substrate 100. In the electronic device 10, the electrodes 31 are joined to the wiring layers 101 by a solder layer 111. For example, the metal layer 80, which is formed on the outer surface 31S and the lower surface 31U of the electrode 31, is joined to the wiring layers 101 by the solder layer 111. The metal layer 80 is formed on the outer surface 31S of the electrode 31 in addition to the lower surface 31U of the electrode 31. That is, the metal layer 80 is formed in three dimensions. Since the metal layer 80 is three-dimensionally joined to the solder layer 111, the solder layer 111 has favorable fillets. The solder layer 111 having such a structure obtains a high joint strength. This improves the connection reliability between the electrode 31 (metal layer 80) and the wiring layer 101 as compared to a structure in which the metal layer 80 is formed on only the lower surface 31U of the electrode 31.

The material of the wiring layer 101 may be, for example, copper or a copper alloy. The material of the solder layer 111 may be, for example, a lead-free solder. Examples of lead-free solder include a Sn—Ag base, a Sn—Cu base, a Sn—Ag—Cu base, or a Sn—Zn—Bi base solder.

Manufacturing Method of Electronic Device 10

A method for manufacturing the electronic device 10 will now be described. To facilitate understanding, portions that ultimately become elements of the electronic device 10 are indicated by reference characters used to denote the final elements.

Figure 8:
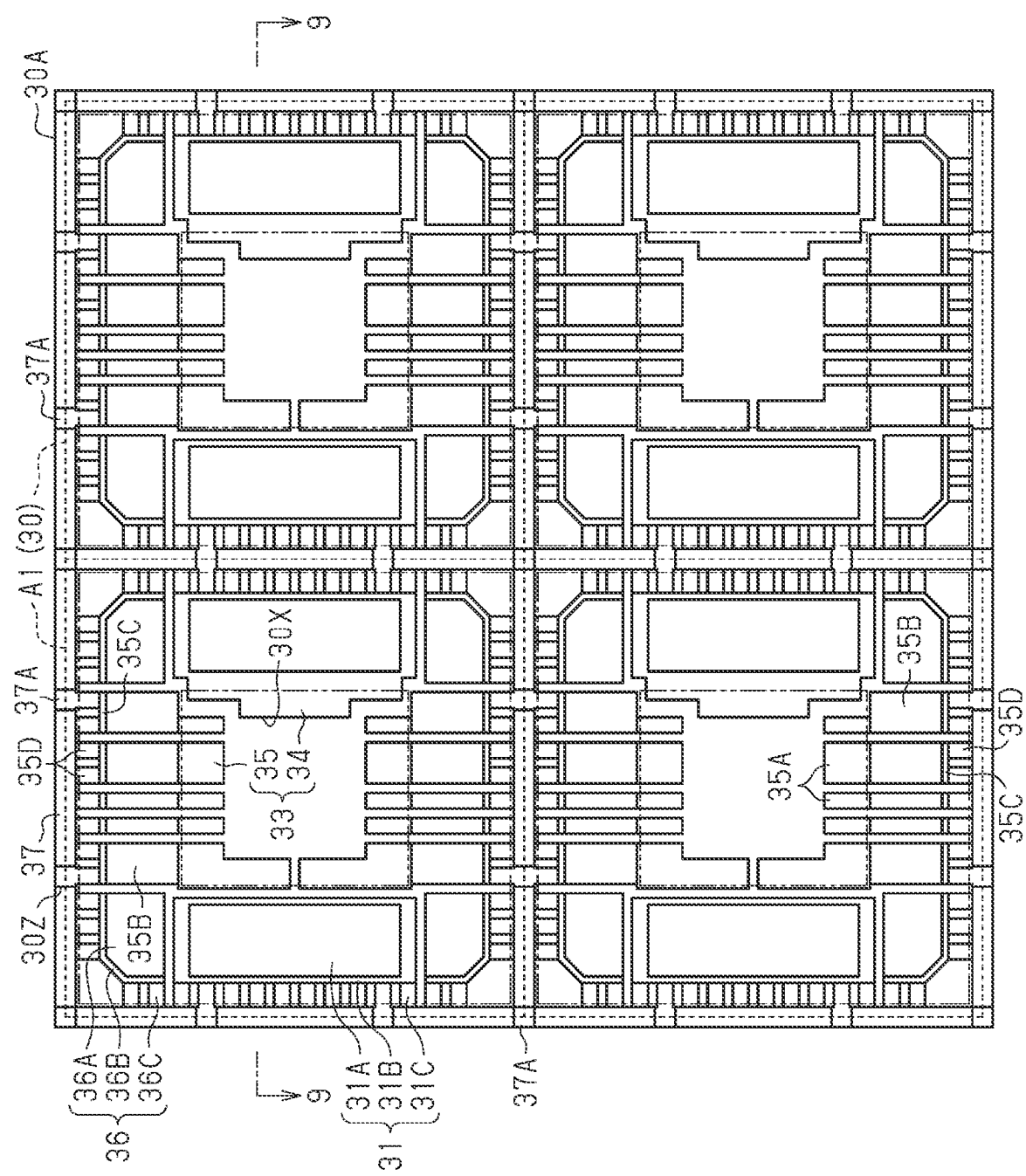
FIG. 8 is a schematic plan view of a first metal plate illustrating a method for manufacturing the electronic device illustrated in FIG. 1.

In the step illustrated in FIG. 8, a large metal plate 30A is prepared. The metal plate 30A includes, for example, multiple separate regions A1 arranged in a matrix (here, 2×2) where the metal plates 30 are formed. In the example illustrated in FIG. 8, the metal plate 30A includes four separate regions A1. However, the number of separate regions A1 is not particularly limited. For the sake of simplicity, the following description will focus on one separate region A1.

As illustrated in FIG. 8, each separate region A1 of the metal plate 30A includes frame portions 37 that are grid-shaped in plan view and an opening 30X that extends from the frame portions 37 toward a center of the separate region A1 in plan view and defines the electrodes 31 and the wirings 33 and 36. At this time, the electrodes 31, the wirings 33, and the wirings 36 formed in each separate region A1 are joined by the frame portions 37 to the electrodes 31, the wirings 33, and the wirings 36 formed in adjacent separate regions A1. Each electrode 31 includes the body 31A and the projections 31B and 31C. The wirings 33 include the wiring 34 and the wirings 35. Each wiring 35 includes the mount portion 35A, the connector 35B, and the projections 35C and 35D. Each wiring 36 includes the body 36A and the projections 36B and 36C. After the structural body corresponding to the electronic device 10 illustrated in FIG. 1 is formed, the separate regions A1 are ultimately cut along cutting lines indicated by single-dashed lines and singulated into separate electronic devices 10. Portions of the separate region A1 located outside the region surrounded by the single-dashed lines, that is, the frame portions 37, are discarded ultimately. FIG. 8 is a plan view of the structural body illustrated in FIG. 9 taken from below.

In the present example, as illustrated in FIG. 9, recesses 30Z are formed in the lower surface of the frame portion 37, the lower surface of the projection 31B of the electrodes 31, the lower surface of the wiring 34, and the lower surface of the mount portion 35A of the wiring 35. Also, as illustrated in FIG. 8, recesses 30Z are formed in the lower surface of the projection 35C of the wiring 35 and the lower surface of the projection 36B of the wiring 36. That is, in the present example, the frame portion 37, the electrode 31, the wirings 34 and 35, and the wiring 36 are thinned from the lower surface. Formation of the recesses 30Z in the frame portion 37 forms protrusions 37A. The thickness of the protrusion 37A is, for example, the same as the thickness of the body 31A of the electrode 31. The lower surface of the protrusion 37A is coplanar with the lower surface of the body 31A. The protrusions 37A are, for example, arranged at given intervals in an extension direction of each frame portion 37.

The opening 30X and the recesses 30Z described above may be, for example, by etching. FIG. 9 is a cross-sectional view taken along line 9-9 in FIG. 8 illustrating mainly a cross-sectional structure of the upper left one of the separate regions A1. Also, FIGS. 10, 11, 13, and 15 to 26 illustrate mainly cross-sectional structures of the same portion.

In the step illustrated in FIG. 10A, a flat metal plate 30A is prepared.

In the step illustrated in FIG. 10B, a resist layer 120 including an open pattern 120X is formed on the upper surface of the metal plate 30A, and a resist layer 121 including open patterns 121X and 121Y is formed on the lower surface of the metal plate 30A. The open patterns 120X and 121X respectively expose the upper surface and the lower surface of the metal plate 30A at portions corresponding to the region in which the opening 30X (refer to FIG. 1) is formed. The open pattern 121Y exposes the lower surface of the metal plate 30A at portions corresponding to the region in which the recesses 30Z (refer to FIG. 9) are formed.

The material of the resist layers 120 and 121 may be, for example, a photosensitive dry film resist or a liquid photoresist (e.g., dry film resist or liquid resist of novolac resin or acrylic resin). For example, when a photosensitive dry film is used, the upper surface or the lower surface of the metal plate 30A is laminated with a dry film through thermocompression bonding, and the dry film is patterned through photolithography to form the resist layers 120 and 121. When a liquid photoresist is used, after applying a liquid photoresist, the resist layers 120 and 121 may be formed by the same steps.

In the step illustrated in FIG. 10C, wet etching is performed on both surfaces of the metal plate 30A using the resist layers 120 and 121 as etching masks to form the opening 30X and the recesses 30Z. For example, both surfaces of the metal plate 30A exposed from the open patterns 120X and 121X in the resist layers 120 and 121 are removed by etching to form the opening 30X. The formation of the opening 30X defines the frame portions 37, the electrodes 31, the wirings 33 including the wirings 34 and 35, and the wirings 36 (refer to FIG. 8) in the separate region A1. Also, in this step, the metal plate 30A exposed from the open pattern 121Y in the resist layer 121 is etched (half-etched) from the lower surface to a given depth so that the metal plate 30A is thinned. As a result, the recesses 30Z are formed in the metal plate 30A exposed from the open pattern 121Y, and the frame portions 37, the electrodes 31, the wirings 33, and the wirings 36 (refer to FIG. 8) are thinned from the lower surface. The etchant used in this step may be selected in accordance with the material of the metal plate 30A. For example, when a copper plate is used as the metal plate 30A, a ferric chloride aqueous solution or a cupric chloride aqueous solution may be used as the etchant. This step may be performed by spray etching both surfaces of the metal plate 30A.

Then, the resist layers 120 and 121 are removed, for example, by an alkaline stripping solution (e.g., organic amine stripping solution, caustic soda, acetone, or ethanol). As a result, as illustrated in FIG. 9, the opening 30X and the recesses 30Z are formed, and the metal plate 30 is formed in the separate region A1. The manufacturing steps described above manufacture the structural body illustrated in FIGS. 8 and 9.

In the present example, the opening 30X and the recesses 30Z are formed by etching. Instead, the opening 30X and the recesses 30Z may be formed by, for example, stamping.

Figure 11:
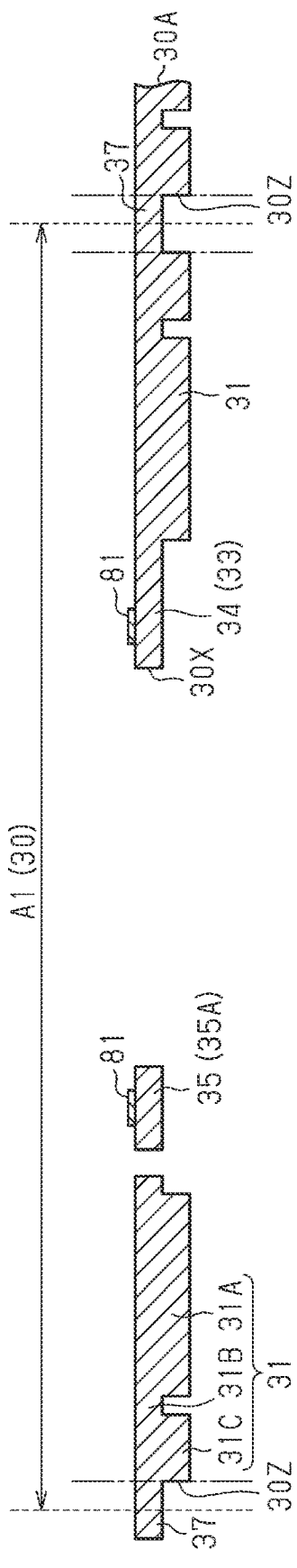
FIG. 11 is a schematic cross-sectional view illustrating a manufacturing step of the first metal plate following FIG. 10C.

In the step illustrated in FIG. 11, the metal layer 81 is formed on the upper surface of the wiring 34 and the upper surface of the mount portion 35A of the wiring 35. In the present example, the metal layer 81 is partially formed on part of the upper surface of the wiring 34, and the metal layer 81 is partially formed on part of the upper surface of the mount portion 35A. The metal layer 81 is, for example, formed on the upper surface of the wirings 34 and 35 in the proximity of the peripheral edges of the mount region of the electronic component 60 (refer to FIG. 1). The metal layer 81 may be formed, for example, through an electrolytic plating process that uses the metal plate 30A as a power feeding layer. For example, the entire surface of the metal plate 30A except the formation region of the metal layer 81 is covered by a resist layer. An electrolytic plating process that uses the resist layer as a plating mask is performed to form the metal layer 81 on the metal plate 30A exposed from the resist layer. Alternatively, a sparger process may be used to form the metal layer 81. Alternatively, the metal layer 81 may be formed on the entire upper surface of the metal plate 30A.

Figure 12:
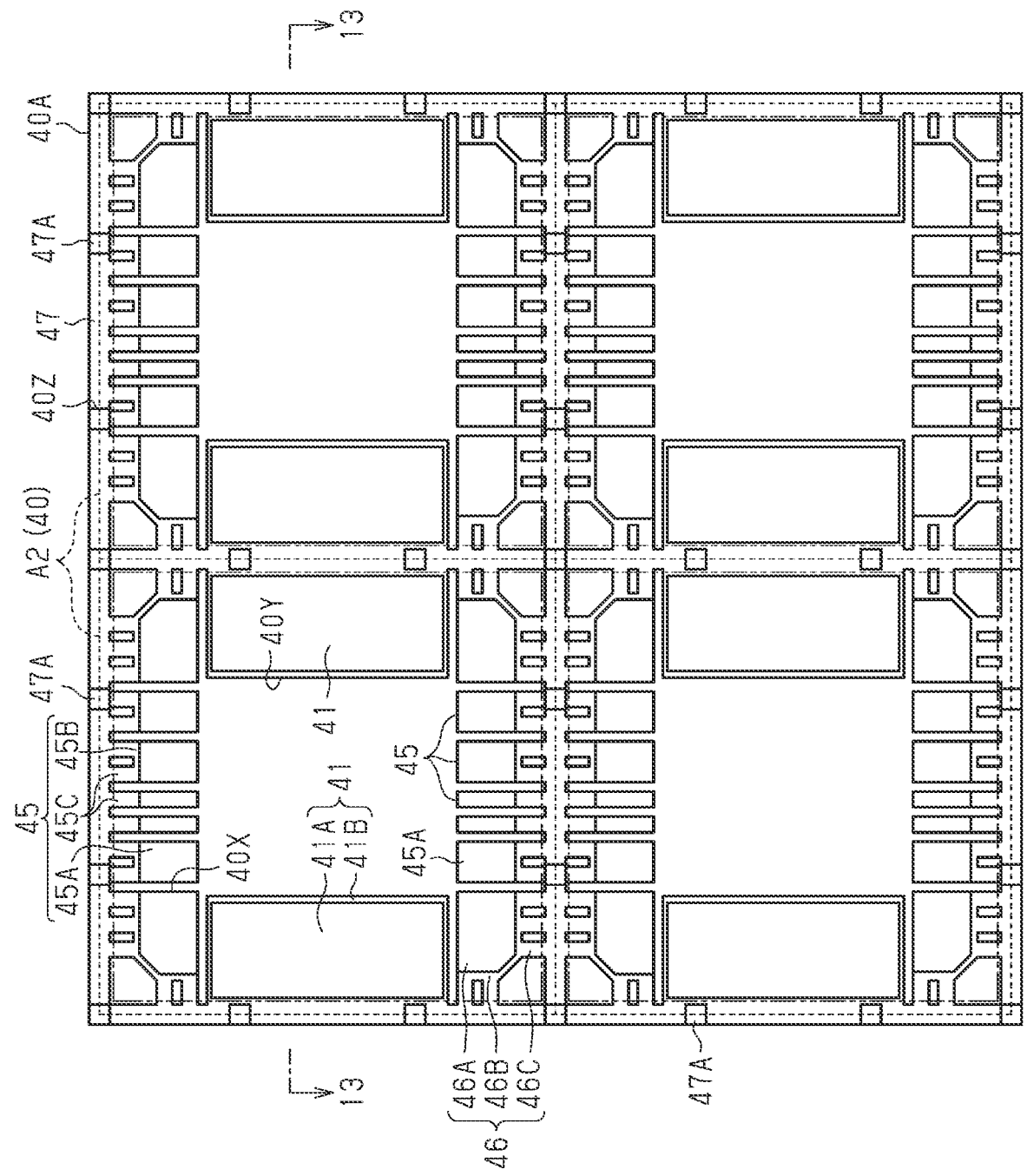
FIG. 12 is a schematic plan view of a second metal plate illustrating a method for manufacturing the electronic device illustrated in FIG. 1.
Figure 13:
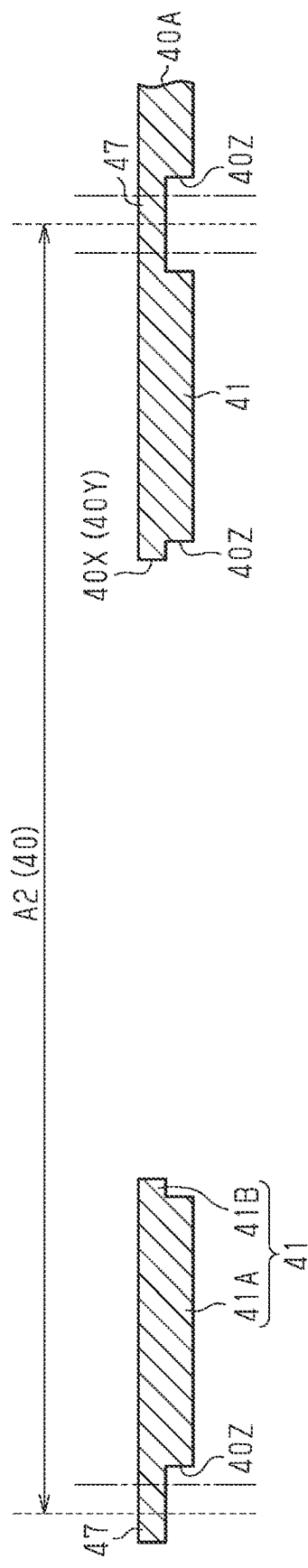
FIG. 13 is a schematic cross-sectional view of the second metal plate in a separate region taken along line 13-13 in FIG. 12.

In the step illustrated in FIGS. 12 and 13, a large metal plate 40A is prepared. The metal plate 40A includes, for example, multiple separate regions A2 arranged in a matrix (here, 2×2) where the metal plates 40 are formed. In the example illustrated in FIG. 12, the metal plate 40A includes four separate regions A2. However, the number of separate regions A2 is not particularly limited. For the sake of simplicity, the following description will focus on one separate region A2.

As illustrated in FIG. 12, each separate region A2 of the metal plate 40A includes frame portions 47 that are grid-shaped in plan view and an opening 40X that extends from the frame portions 47 toward a center of the separate region A2 in plan view and defines the electrodes 41 and the wirings 45 and 46. At this time, the electrodes 41, the wirings 45, and the wirings 46 formed in each separate region A2 are joined by the frame portions 47 to the electrodes 41, the wirings 45, and the wirings 46 formed in adjacent separate regions A2. Each electrode 41 includes the body 41A and the projection 41B. Each wiring 45 includes the body 45A and the projections 45B and 45C. Each wiring 46 includes the body 46A and the projections 46B and 46C. The opening 40X includes the opening 40Y formed in a center of each separate region A2 in plan view. The separate regions A2 are formed corresponding to the separate regions A1 of the metal plate 30A illustrated in FIG. 8. The separate region A2 is the same in planar size as the separate region A1 (refer to FIG. 8). After the structural body corresponding to the electronic device 10 illustrated in FIG. 1 is formed, the separate regions A2 are ultimately cut along cutting lines indicated by single-dashed lines and singulated into separate electronic devices 10. In the separate region A2, portions outside the region surrounded by the single-dashed lines, that is, the frame portions 47, are discarded ultimately. FIG. 12 is a plan view of the structural body illustrated in FIG. 13 taken from below.

In the present example, as illustrated in FIG. 13, recesses 40Z are formed in the lower surface of the frame portion 47 and the lower surface of the projection 41B of the electrode 41. Also, as illustrated in FIG. 12, recesses 40Z are formed in the lower surface of the projections 45B and 45C of the wiring 45 and the lower surface of the projections 46B and 46C of the wiring 46. That is, in the present example, the frame portion 47, the electrode 41, the wiring 45, and the wiring 46 are thinned from the lower surface. Formation of the recesses 40Z in the frame portion 47 forms protrusions 47A. The thickness of the protrusion 47A is, for example, the same as the thickness of the body 41A of the electrode 41. The lower surface of the protrusion 47A is coplanar with the lower surface of the body 41A. The protrusions 47A are, for example, arranged at given intervals in an extension direction of each frame portion 47. The protrusions 47A are, for example, arranged at positions corresponding to the protrusions 37A illustrated in FIG. 8.

The opening 40X and the recesses 40Z may be formed by performing steps that are the same as the steps illustrated in FIGS. 10A to 10C.

Figure 14:
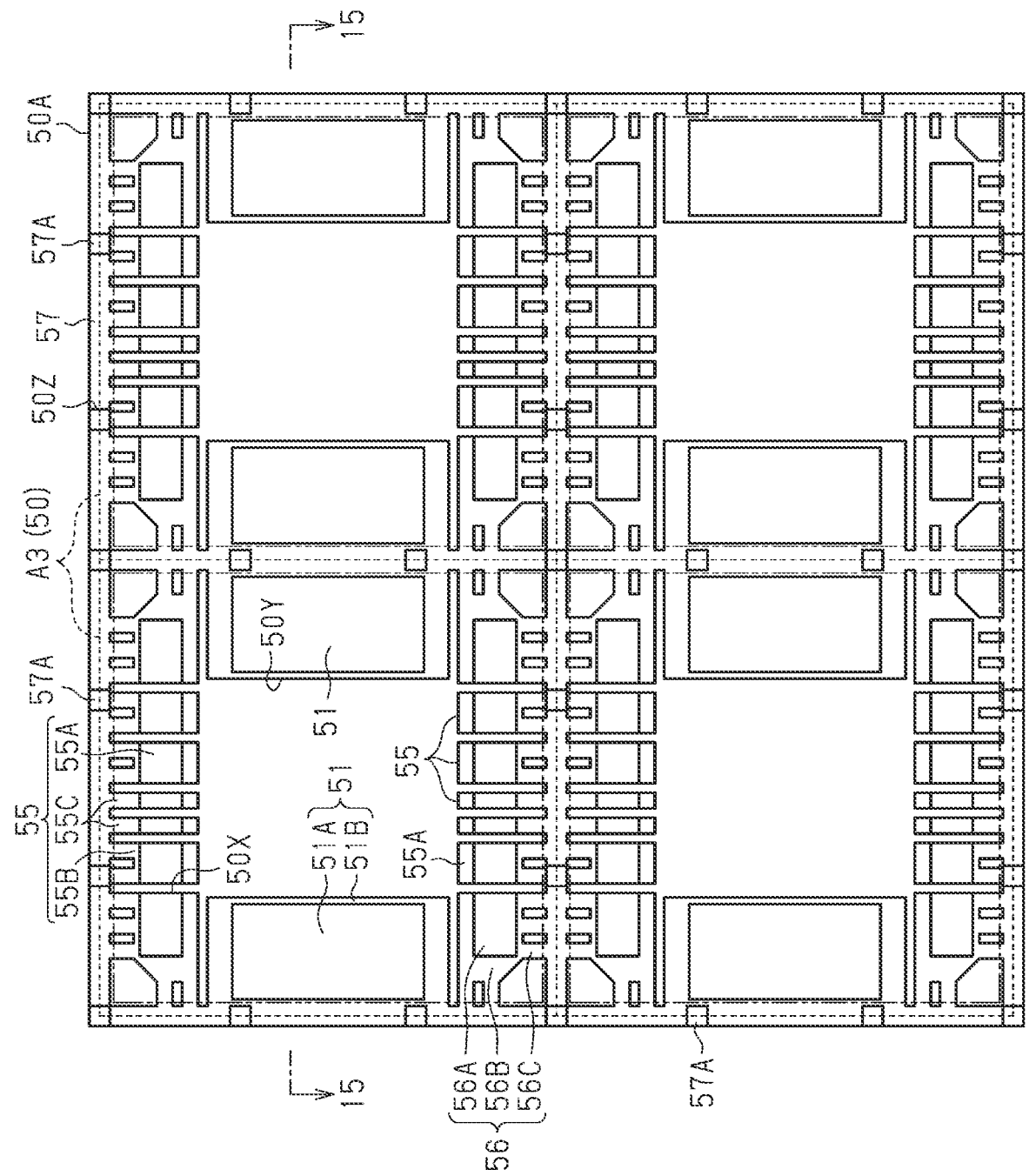
FIG. 14 is a schematic plan view of a third metal plate illustrating a method for manufacturing the electronic device illustrated in FIG. 1.
Figure 15:
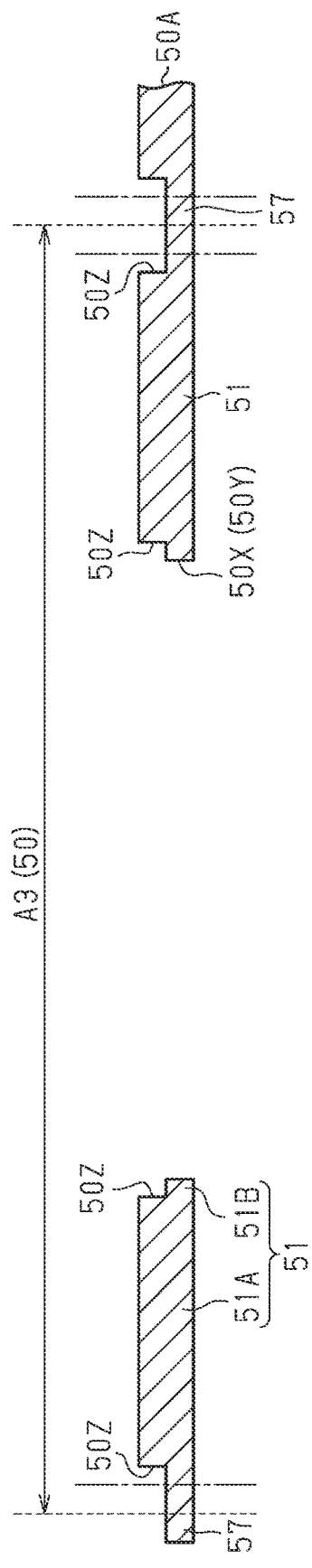
FIG. 15 is a schematic cross-sectional view of the third metal plate in a separate region taken along line 15-15 in FIG. 14.

In the step illustrated in FIGS. 14 and 15, a large metal plate 50A is prepared. The metal plate 50A includes, for example, multiple separate regions A3 arranged in a matrix (here, 2×2) where the metal plates 50 are formed. In the example illustrated in FIG. 14, the metal plate 50A includes four separate regions A3. However, the number of separate regions A3 is not particularly limited. For the sake of simplicity, the following description will focus on one separate region A3.

As illustrated in FIG. 14, each separate region A3 of the metal plate 50A includes frame portions 57 that are grid-shaped in plan view and an opening 50X that extends from the frame portions 57 toward a center of the separate region A3 in plan view and defines the electrodes 51 and the wirings 55 and 56. At this time, the electrodes 51, the wirings 55, and the wirings 56 formed in each separate region A3 are joined by the frame portions 57 to the electrodes 51, the wirings 55, and the wirings 56 formed in adjacent separate regions A3. Each electrode 51 includes the body 51A and the projection 51B. Each wiring 55 includes the body 55A and the projections 55B and 55C. Each wiring 56 includes the body 56A and the projections 56B and 56C. The opening 50X includes the opening 50Y formed in a center of each separate region A3 in plan view. The separate regions A3 are formed corresponding to the separate regions A1 of the metal plate 30A illustrated in FIG. 8 and the separate regions A2 of the metal plate 40A illustrated in FIG. 12. The structural body in the separate regions A3 is cut along the cutting lines indicated by single-dashed lines in the manufacturing process. In the separate region A3, portions outside the region surrounded by the single-dashed lines, that is, the frame portions 57, are discarded ultimately. FIG. 14 is a plan view of the structural body illustrated in FIG. 15 taken from above.

In the present example, as illustrated in FIG. 15, recesses 50Z are formed in the upper surface of the frame portion 57 and the upper surface of the projection 51B of the electrode 51. Also, as illustrated in FIG. 14, recesses 50Z are formed in the upper surface of the projections 55B and 55C of the wiring 55 and the upper surface of the projections 56B and 56C of the wiring 56. That is, in the present example, the frame portion 57, the electrode 51, the wiring 55, and the wiring 56 are thinned from the upper surface. Formation of the recesses 50Z in the frame portion 57 forms protrusions 57A. The thickness of the protrusion 57A is, for example, the same as the thickness of the body 51A of the electrode 51. The upper surface of the protrusion 57A is coplanar with the upper surface of the body 51A. The protrusions 57A are, for example, arranged at given intervals in an extension direction of each frame portion 57. The protrusions 57A are, for example, arranged at positions corresponding to the protrusions 37A illustrated in FIG. 8.

The opening 50X and the recesses 50Z may be formed by performing steps that are the same as the steps illustrated in FIGS. 10A to 10C.

Figure 16:
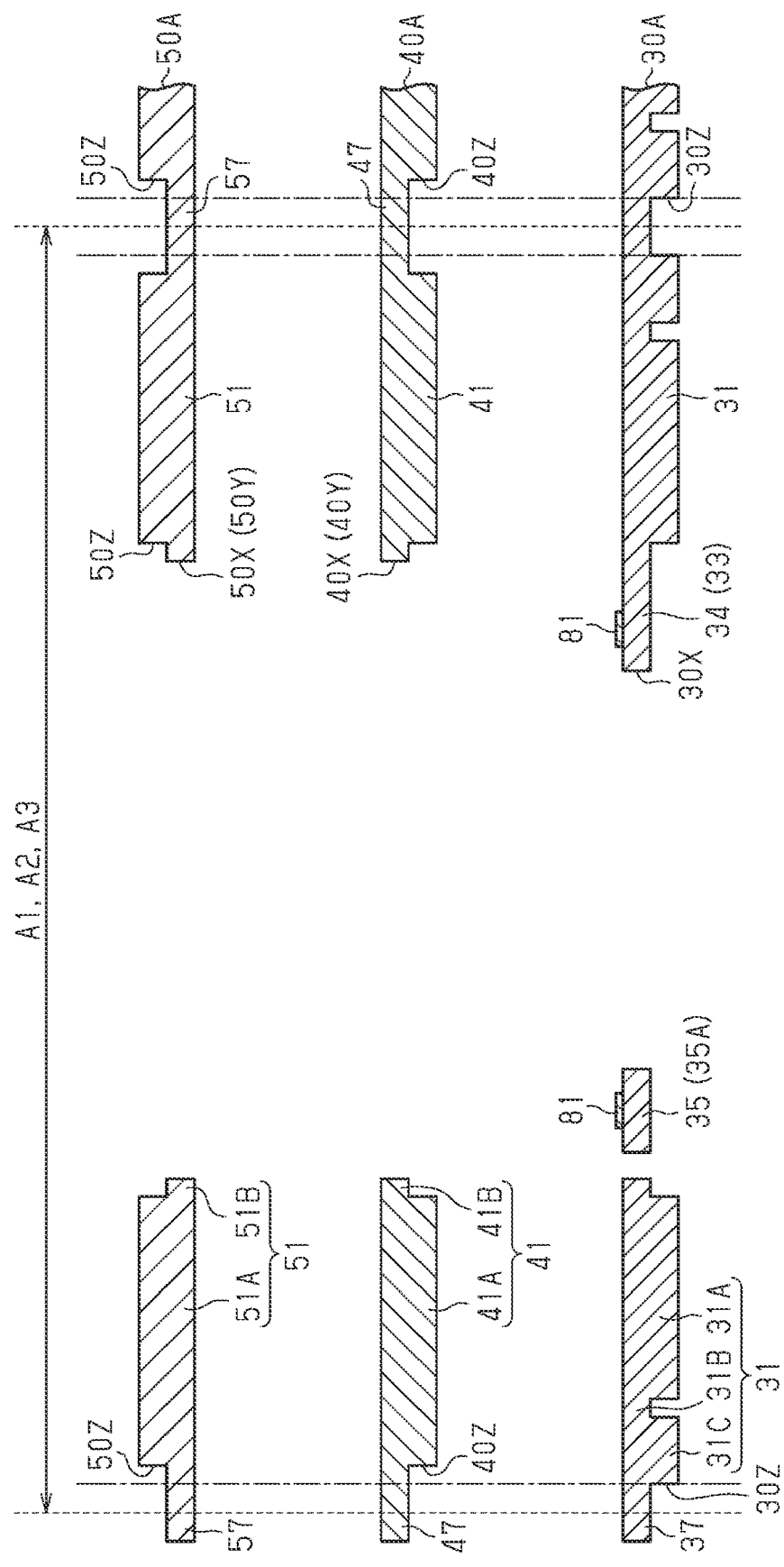
FIG. 16 is a schematic cross-sectional view illustrating a manufacturing step of the third metal plate illustrated in FIGS. 14 and 15.

In the step illustrated in FIG. 16, the metal plate 40A and the metal plate 50A are sequentially located above the metal plate 30A. At this time, the metal plates 30A, 40A, and 50A are located so that the separate regions A1, A2, and A3 overlap each other in plan view. That is, the metal plates 30A, 40A, and 50A are located so that the separate regions A1, A2, and A3 are vertically aligned with each other. For example, the metal plates 30A, 40A, and 50A are located so that the electrodes 31 of the metal plate 30A face the electrodes 41 of the metal plate 40A and that the electrodes 41 face the electrodes 51 of the metal plate 50A. In addition, the metal plates 30A, 40A, and 50A are located so that the opening 40Y in the metal plate 40A and the opening 50Y in the metal plate 50A overlap the wiring 34 and the mount portions 35A of the wirings 35 in plan view. Although not illustrated, the metal plates 30A, 40A, and 50A are located so that the wirings 35 excluding the mount portions 35A, the wirings 45, and the wirings 55 are vertically aligned with each other and that the wirings 36, 46, and 56 are vertically aligned with each other. At this time, the protrusions 37A of the frame portions 37 illustrated in FIG. 8, the protrusions 47A of the frame portions 47 illustrated in FIG. 12, and the protrusions 57A of the frame portions 57 illustrated in FIG. 14 overlap each other in plan view.

Figure 17:
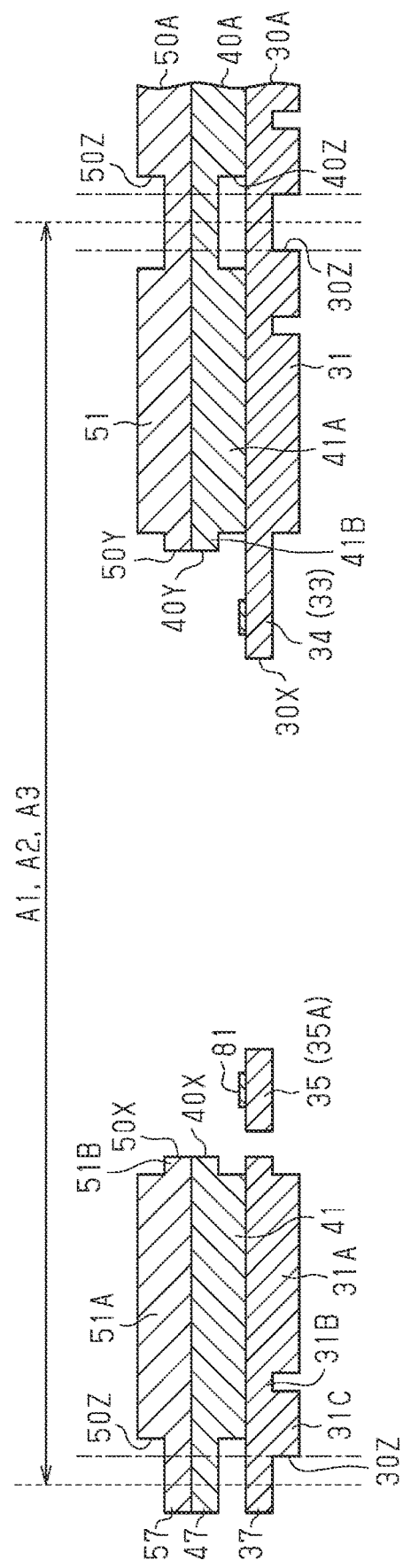
FIGS. 17, 18, 19, 20, 21, 22, 23, 24, 25, and 26 are schematic cross-sectional views illustrating a method for manufacturing the electronic device illustrated in FIG. 1.

In the step illustrated in FIG. 17, the metal plate 30A, the metal plate 40A, and the metal plate 50A are bonded by diffusion bonding. When the metal plate 40A is stacked on the upper surface of the metal plate 30A, and the metal plate 50A is stacked on the upper surface of the metal plate 40A, diffusion bonding is performed in a vacuum while applying heat and pressure. For example, when copper is used as the material of the metal plates 30A, 40A, and 50A, the heating temperature may be approximately 500° C. to 800° C., and the pressure may be approximately 0.005 to 0.015 kN/mm². The metal plate 30A and the metal plate 40A that are joined by diffusion bonding are integrated without a boundary surface. The upper surface of the metal plate 30A is directly joined to the lower surface of the metal plate 40A. Also, the metal plate 40A and the metal plate 50A that are joined by diffusion bonding are integrated without a boundary surface. The upper surface of the metal plate 40A is directly joined to the lower surface of the metal plate 50A.

In this step, in the frame portions 37, 47, and 57, the protrusions 37A (refer to FIG. 8), the protrusions 47A (refer to FIG. 12), and the protrusions 57A (refer to FIG. 14) are vertically aligned with each other, so that pressure is appropriately applied to the frame portions 37, 47, and 57 through the protrusions 37A, 47A, and 57A. That is, even when the thickness of the frame portions 37, 47, and 57 is reduced by formation of the recesses 30Z, 40Z, and 50Z, the protrusions 37A, 47A, and 57A allow for appropriate application of pressure to the frame portions 37, 47, and 57. In this step, the protrusions 47A are diffusion-bonded to the upper surface of the protrusions 37A, and the protrusions 57A are diffusion-bonded to the upper surface of the protrusions 47A.

Figure 18:
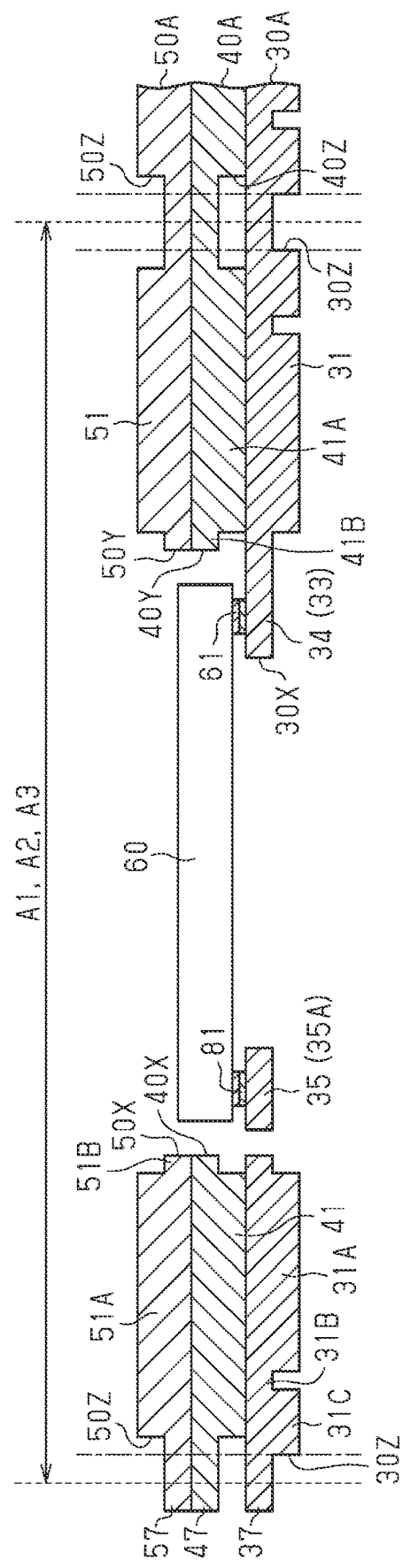

In the step illustrated in FIG. 18, the electronic component 60 including the bumps 61 on the circuit formation surface is prepared. The electronic component 60 is mounted on the upper surface of the wirings 33 in each separate region A1. For example, the bumps 61 of the electronic component 60 are flip-chip-joined to the metal layers 81 formed on the upper surface of the wiring 34 and the upper surface of the mount portion 35A of the wiring 35 in the separate region A1.

Figure 19:
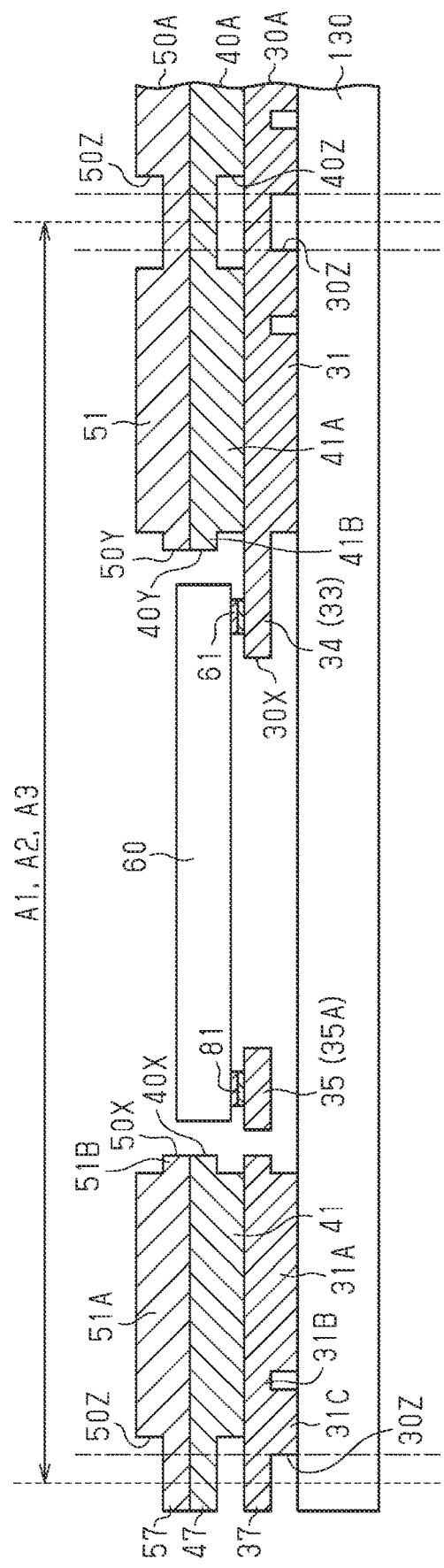

In the step illustrated in FIG. 19, a tape 130 is adhered to the lower surface of the metal plate 30A. For example, the tape 130 has a surface on which an adhesive (not illustrated) is applied, and the surface of the tape 130 is attached to the lower surface of the metal plate 30A. For example, the lower surface of the metal plate 30A is laminated with a sheet of tape 130 through thermocompression bonding. The material of the tape 130 may have, for example, a superior chemical resistance or a superior thermal resistance. The material of the tape 130 may be, for example, a polyimide resin or a polyester resin. A material that allows for easy removal of the tape 130 from the insulation layer 70 (refer to FIG. 1), which is formed by molding in a subsequent step, may be used as the adhesive of the tape 130. The material of such an adhesive may be, for example, a silicone-base adhesive material.

Figure 20:
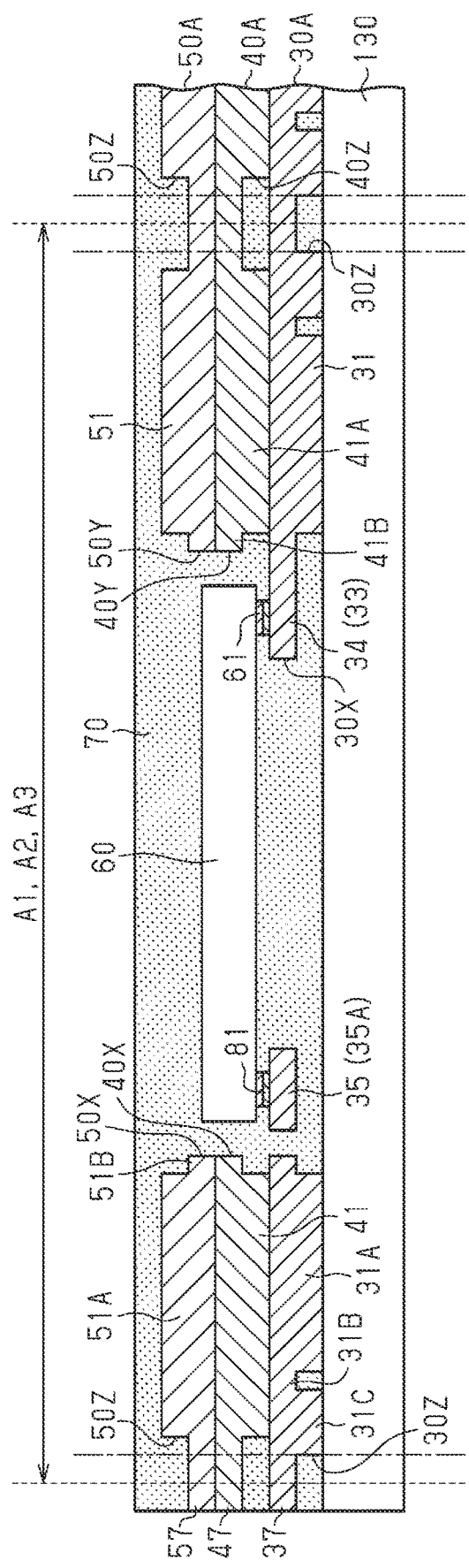

In the step illustrated in FIG. 20, the insulation layer 70 is formed on the upper surface of the tape 130 to encapsulate the metal plates 30A, 40A, and 50A and the electronic component 60. For example, the insulation layer 70 is formed on the upper surface of the tape 130 to fill the openings 30X, 40X, and 50X and the recesses 30Z, 40Z, and 50Z and cover the upper surface of the metal plate 50A and the entirety of the electronic component 60. The insulation layer 70 may be formed, for example, through a resin molding process. For example, when a thermosetting mold resin is used as the material of the insulation layer 70, the structural body illustrated in FIG. 19 is accommodated in a mold. Pressure (e.g., 5 to 10 MPa) is applied to the mold, and a liquidized mold resin is drawn into the mold. Then, the mold resin is heated and cured at a temperature of approximately 180° C. to form the insulation layer 70. During the encapsulation process in this step, the tape 130 limits leakage of the mold resin to the lower surface of the metal plate 30A (may be referred to as "mold flash"). The process for filling the mold with the mold resin includes, for example, a transfer molding, a compression molding, and an injection molding.

In this step, the recesses 30Z, 40Z, and 50Z are respectively formed in the metal plates 30A, 40A, and 50A. In this structure, resin appropriately fills inner side regions of the separate regions A1, A2, and A3 through the recesses 30Z, 40Z, and 50Z.

Figure 21:
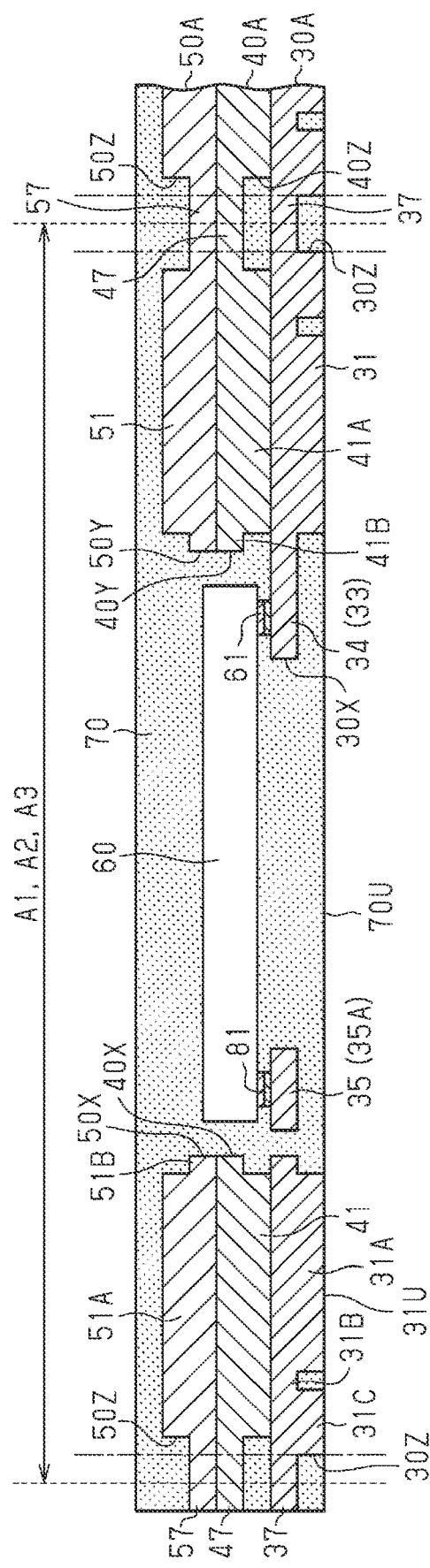

When the encapsulation process is completed, the structural body covered by the insulation layer 70 is removed from the mold. Subsequently, the tape 130 is removed (separated) from the metal plate 30A and the insulation layer 70. The tape 130 is, for example, mechanically removed from the metal plate 30A and the insulation layer 70. As a result, as illustrated in FIG. 21, the lower surface of the metal plate 30A and the lower surface 70U of the insulation layer 70 are exposed to the exterior. The lower surface of the metal plate 30A and the lower surface 70U of the insulation layer 70, which were in contact with the upper surface of the tape 130 (refer to FIG. 20), are substantially flush with each other. At this time, after removal of the tape 130, the adhesive of the tape 130 may partially remain on the lower surface of the metal plate 30A. Such a possible remaining adhesive may be removed, for example, by ashing (dry etching using oxygen plasma).

Figure 22:
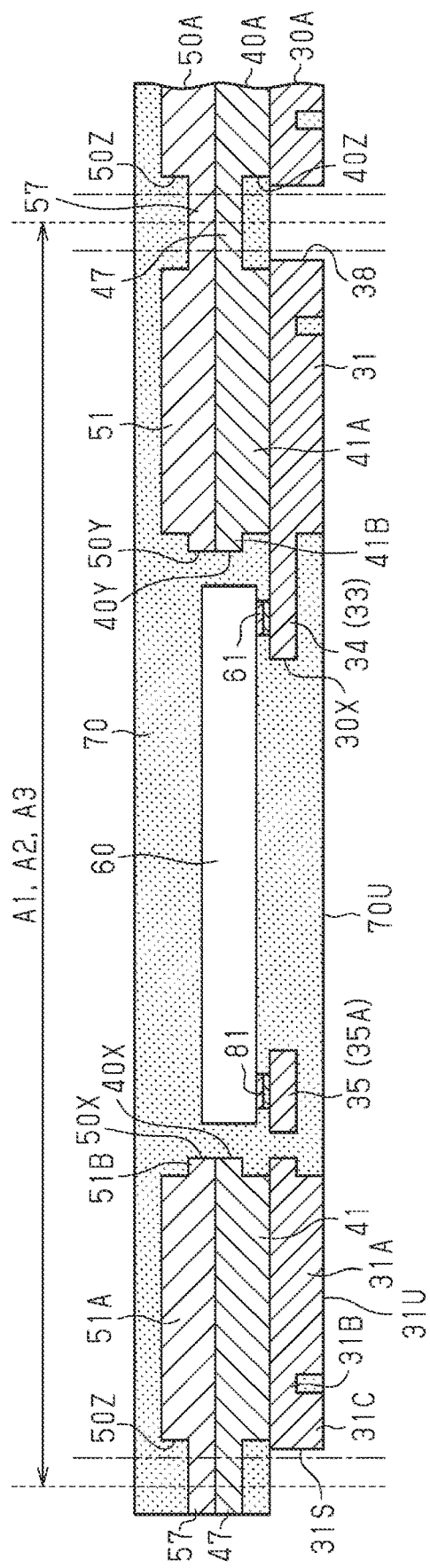

In the step illustrated in FIG. 22, half cutting (polishing) is performed on the structural body illustrated in FIG. 21 to an intermediate position in the thickness-wise direction to form a groove 38. In half cutting of the present example, the frame portion 37 (refer to FIG. 21) is removed from the metal plate 30A to form the groove 38 extending through the metal plate 30A in the thickness-wise direction. As a result, the outer surfaces 31S of the electrodes 31 are exposed to the exterior, and part of the lower surface of the insulation layer 70 covering the side surfaces of the bodies 41A of the electrodes 41 is exposed to the exterior. The groove 38 is, for example, wider than a cutting region (see single-dashed lines) of the metal plates 30A and 40A. The inner side surface of the groove 38 is located closer to the peripheral edge of the separate regions A1 and A2 than the side surface of the body 41A of the electrode 41. Therefore, even when the groove 38 is formed deeper than the designed value, the polishing of the side surface of the body 41A is appropriately avoided. The groove 38 may be formed, for example, with a dicing blade or a slicer. In this step, the electrodes 31 are separated from the wirings 35 and the wirings 36 (refer to FIG. 8).

Figure 23:
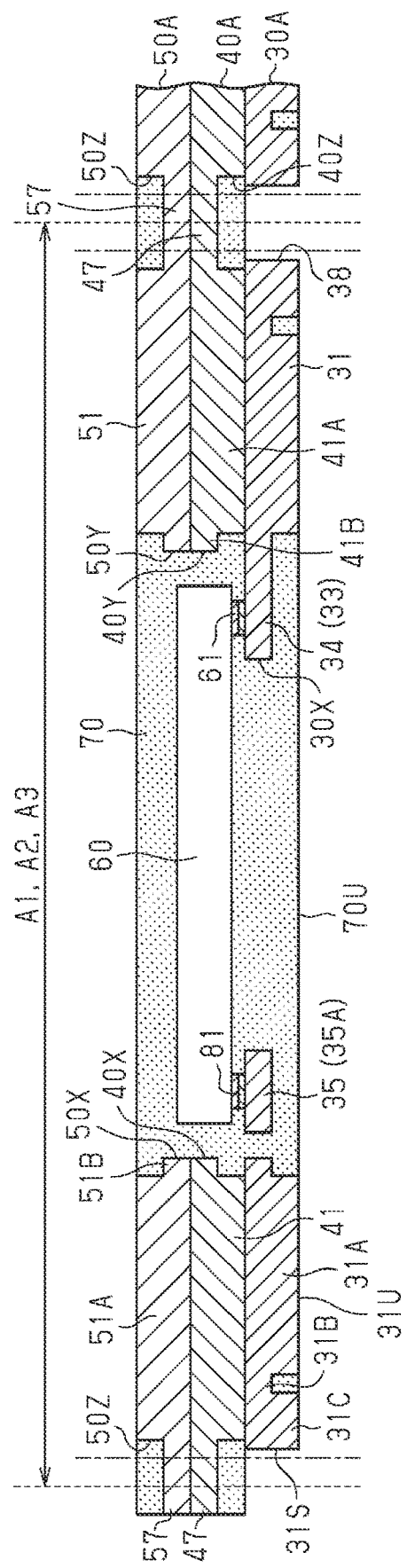

In the step illustrated in FIG. 23, the upper surface of the insulation layer 70 is polished so that the upper surface of the metal plate 50A is exposed to the exterior. For example, the upper surface of the insulation layer 70 is polished so that the upper surface of the metal plate 50A is flush with the upper surface of the insulation layer 70. The insulation layer 70 is polished by buffing or blasting. When the lower surface of the metal plate 30A is covered by the insulation layer 70 such as mold flash, the lower surface 70U of the insulation layer 70 may also be polished to remove the mold flash.

Figure 24:
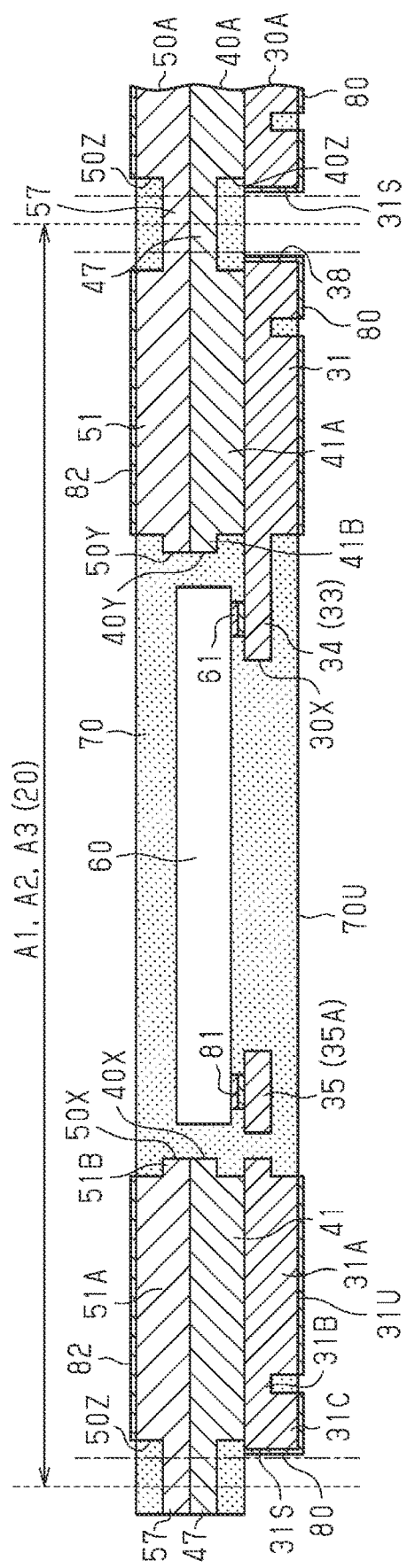

In the step illustrated in FIG. 24, the metal layer 80 is formed on the side and lower surfaces of the metal plate 30A exposed from the insulation layer 70, and the metal layer 82 is formed on the upper surface of the metal plate 50A exposed from the insulation layer 70. The metal layers 80 and 82 may be formed, for example, through an electrolytic plating process that uses the metal plates 30A, 40A, and 50A as a power feeding layer.

The manufacturing steps described above manufacture the structural body corresponding to the wiring substrate 20 illustrated in FIG. 1 in the separate regions A1, A2, and A3.

Figure 25:
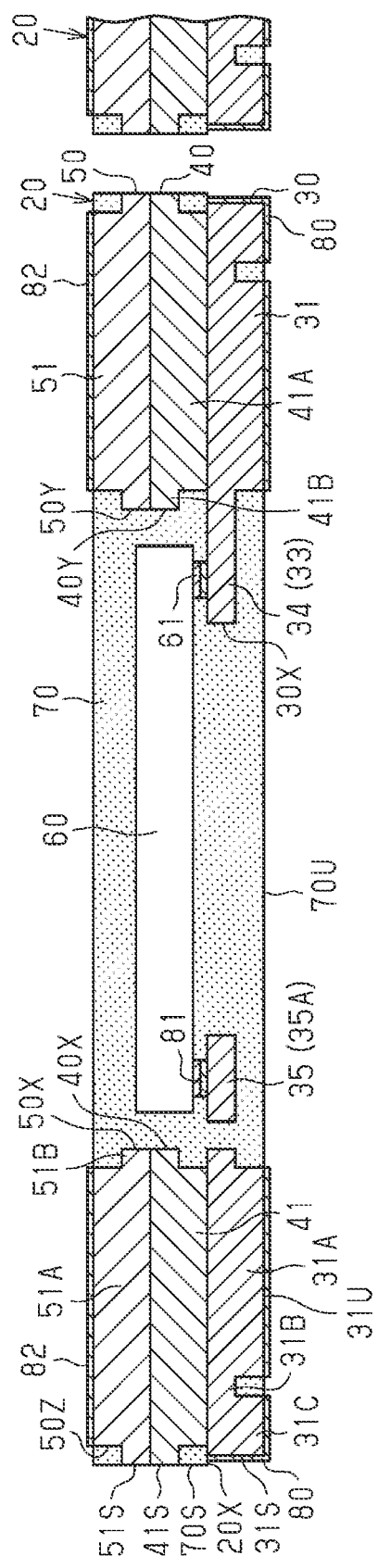

The insulation layer 70 and the frame portions 47 and 57 are cut in the cutting positions indicated by single-dashed lines in the drawings with a dicing saw or the like to singulate the wiring substrate 20. In the present example, in the separate regions A1, A2, and A3, the cutting positions are set to positions outward from the side surface of the metal layer 80 covering the outer surface 31S of the electrode 31. Therefore, a situation in which the dicing saw damages the surface of the metal layer 80 may be appropriately avoided. In this step, as illustrated in FIG. 25, the cut surfaces, that is, the outer surface 41S of the electrode 41, the outer surface 51S of the electrodes 51, and the outer surface 70S of the insulation layer 70, are substantially flush with each other.

The manufacturing steps described above simultaneously manufacture a batch of wiring substrates 20. After singulation, the wiring substrate 20 may be inverted upside down and used or may be arranged at any angle.

Next, each wiring substrate 20 undergoes various electric inspections (e.g., open or short circuit). The electric inspections determine whether the wiring substrate 20 is good or defective.

Figure 26:
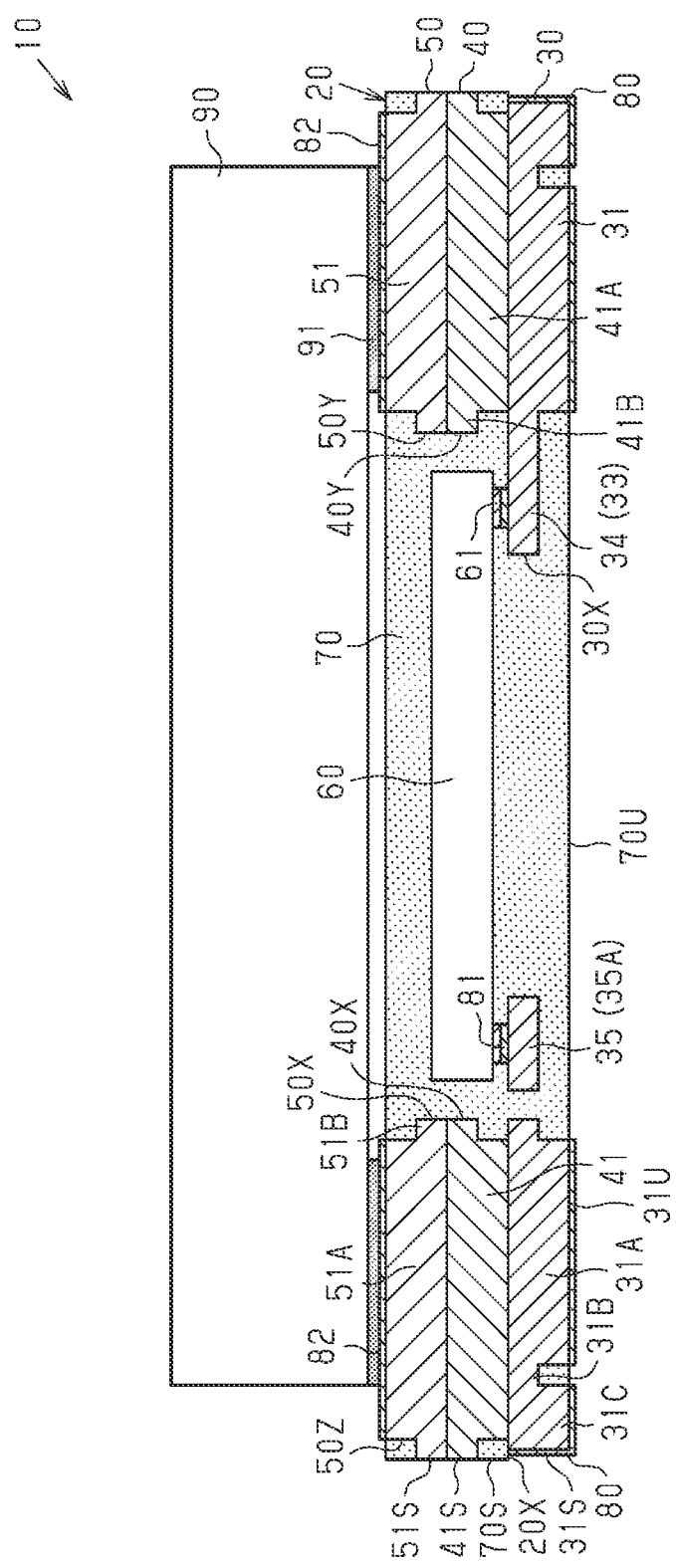

In the step illustrated in FIG. 26, the electronic component 90 is mounted on the wiring substrate 20 that the electric inspections have determined is good. The electronic component 90 is mounted on the metal layer 82, which is formed on the upper surface of the electrodes 51 of the wiring substrate 20, by the joint material 91.

The manufacturing steps described above manufacture the electronic device 10 illustrated in FIG. 1. The electronic device 10 may be inverted when used or may be arranged at any angle.

The present embodiment has advantages described below.

(1) The electrodes 41 are diffusion-bonded to the upper surface of the electrodes 31. Integration of the electrodes 31 with the electrodes 41 through diffusion bonding appropriately limits increases in the electric resistance of the portion connecting the electrodes 31 and the electrodes 41. In other words, the electrodes 31 are connected to the electrodes 41 with a lower resistance than when build-up wiring layers are connected by via wirings. Therefore, the reliability of the electric connection between the electrodes 31 and the electrodes 41 is improved.

(2) In addition, the integration of the electrodes 31 with the electrodes 41 through diffusion bonding directly joins the electrodes 31 to the electrodes 41. For example, as compared to a structure in which the electrodes 31 are joined to the electrodes 41 by a joint material, the electrodes 31 are connected to the electrodes 41 with a low resistance. Therefore, the reliability of the electric connection between the electrodes 31 and the electrodes 41 is improved.

(3) The metal plate 40 includes the opening 40Y that is large enough to accommodate the electronic component 60 and exposes the wiring 34 and the mount portions 35A, on which the electronic component 60 is mounted. This allows the electronic component 60 to be mounted on the metal plate 30 after the metal plate 30 is diffusion-bonded to the metal plate 40. Thus, the wiring substrate 20 is manufactured by simple manufacturing steps, thereby improving the assembly reliability of the wiring substrate 20.

(4) The body 31A of the electrode 31 is solid, and the body 41A of the electrode 41 is solid. The body 41A is diffusion-bonded to the upper surface of the body 31A. This increases the area in which the electrodes 31 are joined to the electrodes 41 as compared to a structure in which via wirings are connected to build-up wiring layers. Thus, the electrodes 31 are connected to the electrodes 41 with a low resistance, thereby improving the reliability of the electric connection between the electrodes 31 and the electrodes 41.

(5) When heat is generated in the electronic components 60 and 90, the heat is dissipated through the electrodes 31 including the solid bodies 31A and the electrodes 41 including the solid bodies 41A. The electrodes 31 and 41, which have a large volume, efficiently dissipate heat generated in the electronic components 60 and 90. As a result, increases in the temperature of the electronic components 60 and 90 are limited.

(6) The electrode 31 includes the projection 31B that is thinner than the body 31A. The electrode 41 includes the projection 41B that is thinner than the body 41A. The projections 31B and 41B form a space between the electrode 31 and the electrode 41. With this structure, when forming the insulation layer 70, the resin appropriately fills regions located at an inner side of the electrodes 31 and 41 through the space between the electrode 31 and the electrode 41.

Thus, even when the solid bodies 31A and 41A are joined to each other, the resin is appropriately filled.

(7) The frame portions 37 include the recesses 30Z, and the frame portions 47 include the recesses 40Z. The recesses 30Z and 40Z form spaces between the frame portions 37 and the frame portions 47. With this structure, when forming the insulation layer 70, the resin appropriately fills regions located at an inner side of the frame portions 37 and 47 through the spaces between the frame portions 37 and the frame portions 47. Thus, the filling of resin is improved.

(8) The protrusions 37A are arranged in the frame portions 37 at given intervals. The protrusions 47A are arranged in the frame portions 47 at given intervals. The protrusions 37A and the protrusions 47A overlap in plan view. In this structure, when the metal plate 30 is diffusion-bonded to the metal plate 40, the protrusions 37A and the protrusions 47A are vertically aligned with each other. This allows pressure to be appropriately applied to the frame portions 37 and 47 through the protrusions 37A and 47A. Therefore, even when the frame portions 37 and 47 are thinned by the recesses 30Z and 40Z, pressure is appropriately applied to the frame portions 37 and 47.

(9) The electrodes 51 are diffusion-bonded to the upper surface of the electrodes 41. This structure increases the thickness from the upper surface of the metal plate 30, that is, the surface on which the electronic component 60 is mounted, to the upper surface of the electrodes 51. In this structure, even when the thickness of the electronic component 60 is increased, the thickness of the electrodes 41 and 51 may be increased so that the thickness from the upper surface of the metal plate 30 to the upper surface of the electrodes 51 is adjusted to a thickness allowing for incorporation of the electronic component 60.

(10) The metal layer 80 continuously covers the outer surface 31S of the electrode 31 and the lower surface 31U of the electrode 31. In this structure, the metal layer 80 is formed in three dimensions. Since the metal layer 80 is three-dimensionally joined to, for example, the solder layer 111, the solder layer 111 has favorable fillets. The solder layer 111 having such a structure obtains a high joint strength. This improves the connection reliability between the electrode 31 (metal layer 80) and the wiring layer 101 as compared to a structure in which the metal layer 80 is formed on only the lower surface 31U of the electrode 31.

(11) The electronic component 90 is mounted on a position overlapping the electronic component 60 in plan view. The planar size of the electronic device 10 is reduced as compared to, for example, a structure in which electronic components are arranged next to each other on a lead frame.

(12) The metal plate 30, the metal plate 40, and the metal plate 50 may be separately manufactured. Therefore, materials of the metal plates 30, 40, and 50 may be individually selected, and the metal plates 30, 40, and 50 may be used in various applications.

(13) The insulation layer 70 covers the lower surface of the projection 31B, which is thinner than the body 31A. This improves the adhesion of the insulation layer 70 to the electrode 31. Also, the insulation layer 70 covers the lower surface of the projection 35C, which is thinner than the connector 35B. This improves the adhesion of the insulation layer 70 to the wiring 35. Also, the insulation layer 70 covers the lower surface of the projection 36B, which is thinner than the body 36A. This improves the adhesion of the insulation layer 70 to the wiring 36.

It should be apparent to those skilled in the art that the foregoing embodiments may be implemented in many other specific forms without departing from the scope of this disclosure. Particularly, it should be understood that the foregoing embodiments may be implemented in the following forms.

The embodiment may be modified as follows. The embodiment and the following modified examples may be combined as long as the combined modified examples remain technically consistent with each other.

In the manufacturing process of the embodiment, after the wiring substrate 20 is singulated, the electronic component 90 is mounted on the wiring substrate 20. However, there is no limitation to such a configuration.

Figure 27:
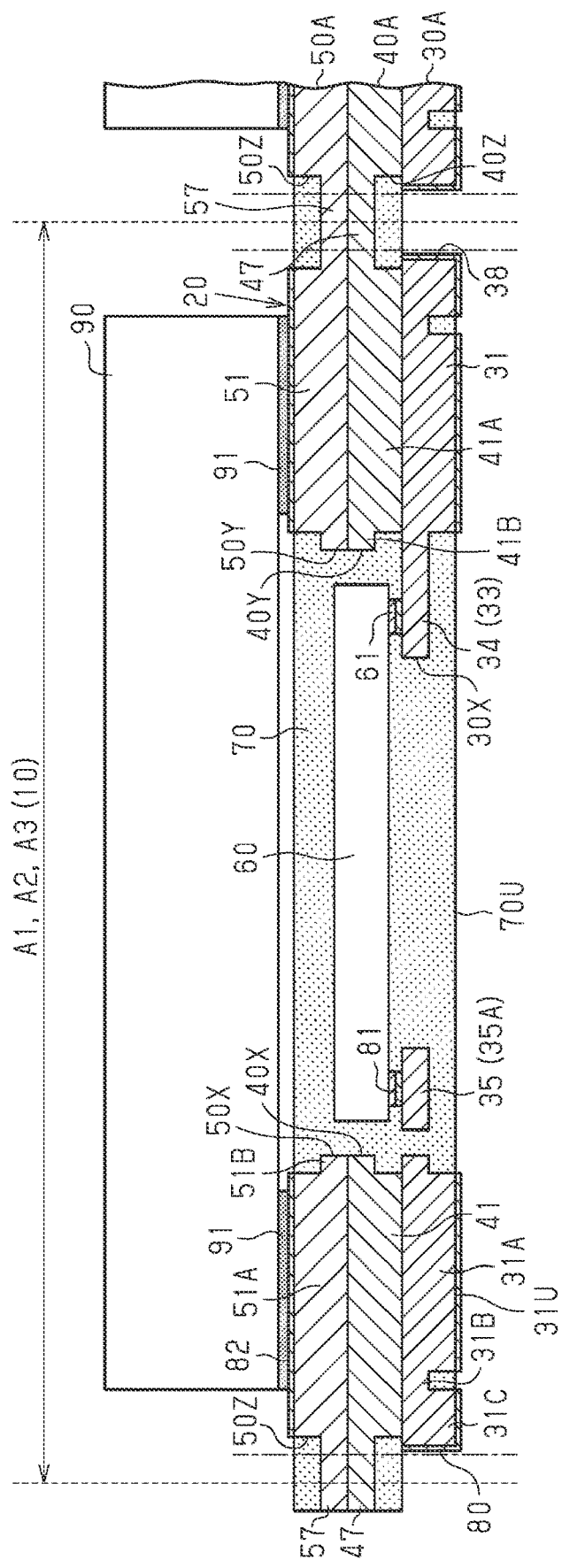
FIG. 27 is a schematic cross-sectional view illustrating a method of manufacturing a modified example of an electronic device.

For example, as illustrated in FIG. 27, before the wiring substrate 20 is singulated, the electronic component 90 may be mounted on the upper surface of the electrodes 51 in the separate regions A1, A2, and A3. In this case, after the electronic component 90 is mounted, the insulation layer 70 and the frame portions 47 and 57 are cut in the cutting positions indicated by single-dashed lines in the drawings with a dicing saw or the like to singulate the electronic device 10.

In the embodiment, a single electronic component 90 is mounted on the wiring substrate 20. Instead, multiple electronic components may be mounted on the wiring substrate 20.

Figure 28:
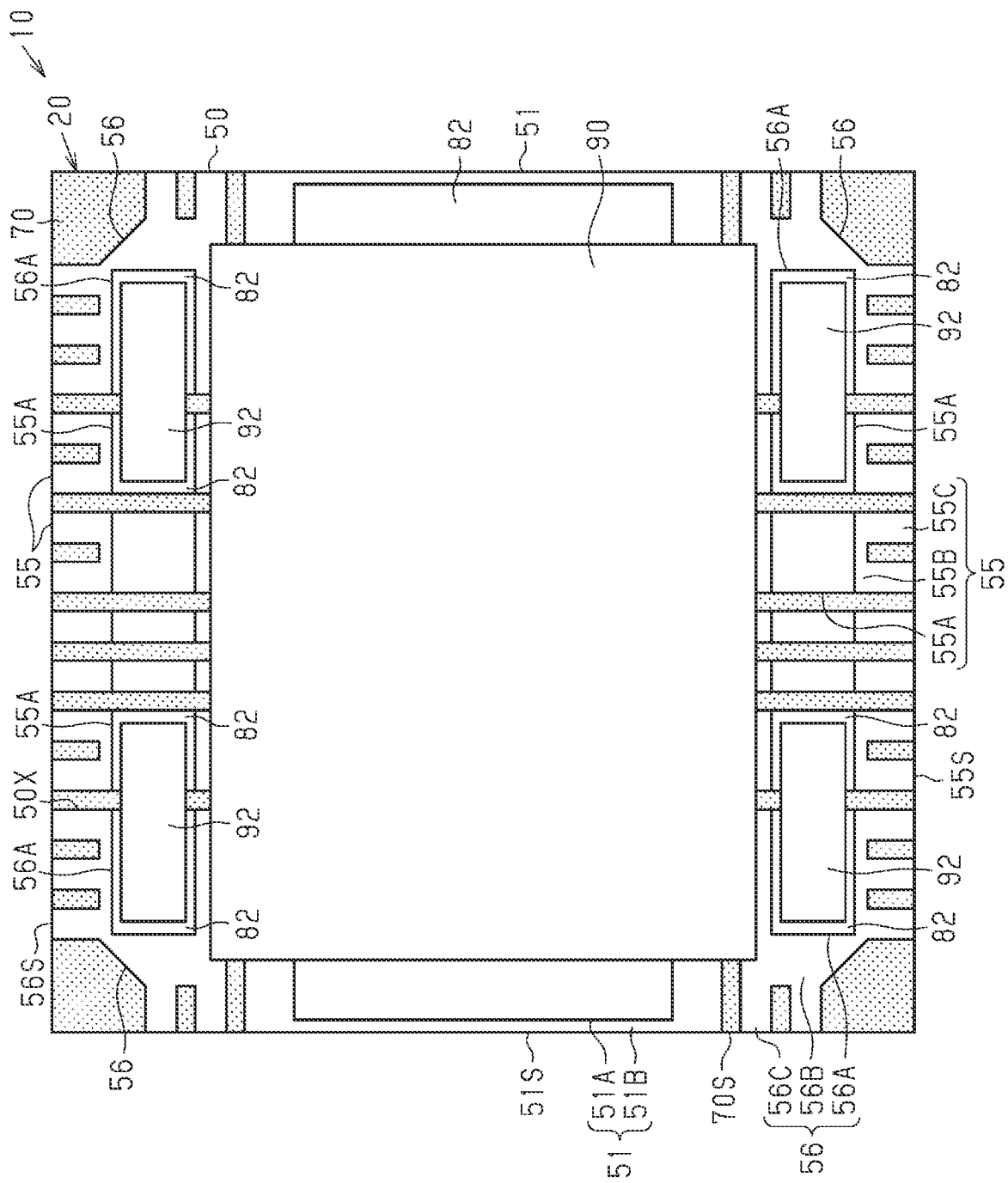
FIG. 28 is a schematic plan view illustrating a modified example of an electronic device.

For example, as illustrated in FIG. 28, the electronic component 90 and electronic components 92 may be mounted on the wiring substrate 20. Each electronic component 92 may be, for example, a passive component such as a chip capacitor, a chip inductor, or a chip resistor or an active component such as semiconductor chip, a transistor, or a diode. The electronic component 92 may be, for example, a silicon component or a ceramic component. In the present embodiment, the electronic component 92 is a chip capacitor.

The electronic component 92, for example, extends over the opening 50X between the wiring 55 and the wiring 56 and is mounted on the upper surfaces of the wirings 55 and 56 located at opposite sides of the opening 50X. The electronic component 92 is mounted on, for example, the metal layer 82 formed on the upper surface of the wirings 55 and 56.

In the embodiment, the recesses 30Z may be omitted from the metal plates 30 and 30A.

In the embodiment, the recesses 40Z may be omitted from the metal plates 40 and 40A.

In the embodiment, the recesses 50Z may be omitted from the metal plates 50 and 50A.

Figure 29:
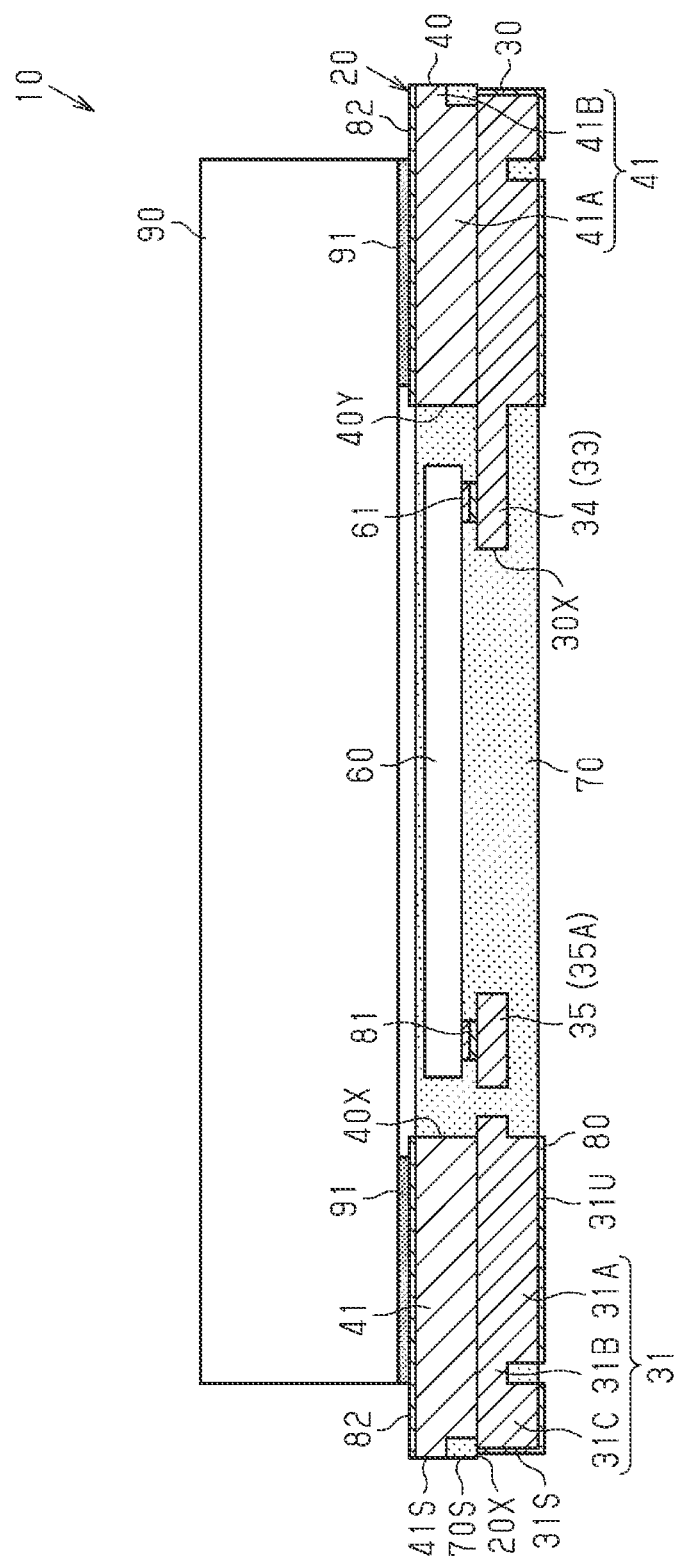
FIG. 29 is a schematic cross-sectional view illustrating a modified example of an electronic device.

As illustrated in FIG. 29, the metal plate 50 (refer to FIG. 1) may be omitted from the wiring substrate 20. In this case, the upper surface of the electrode 41, that is, the upper surface of the body 41A, is exposed from the upper surface of the insulation layer 70. The upper surface of the electrode 41 exposed from the insulation layer 70 is used as, for example, an electrode pad connected to the electronic component 90. The metal layer 82 is formed on the upper surface of the electrode 41 exposed from the insulation layer 70. In this case, the insulation layer 70 fills, for example, the space between the metal plate 30 and the metal plate 40 and the space between the electronic component 60 and the metal plates 30 and 40.

In the embodiment, the metal layer 80 continuously covers the outer surface 31S and the lower surface 31U of the electrode 31. However, there is no limitation to such a configuration. The metal layer 80 may cover, for example, only the lower surface 31U of the electrode 31.

In the embodiment, the metal layers 80, 81, 82 may be formed through an electrolytic plating process. Instead, the metal layers 80, 81, and 82 may be formed through an electroless plating process.

In the embodiment, the number of electronic components 60 incorporated in the wiring substrate 20 is not particularly limited. For example, two or more electronic components 60 may be mounted on the upper surface of the metal plate 30. Electronic components incorporated in the wiring substrate 20 are not limited to one kind. Different kinds of electronic component may be incorporated.

In the embodiment, the mode of mounting the electronic components 60 and 90 may be modified or changed in various manners. The mode of mounting the electronic components 60 and 90 may be, for example, flip-chip mounting, wire bonding mounting, solder mounting, or a combination of these.

In the electronic device 10 of the embodiment, the electronic component 90 mounted on the upper surface of the metal plate 50 may be encapsulated with a resin such as a mold resin. That is, an encapsulation resin may be formed on the upper surface of the wiring substrate 20 to encapsulate the electronic component 90.

The structure of the wiring substrate 20 in the embodiment is not particularly limited. In the embodiment, three layers, namely, the metal plates 30, 40, and 50, are stacked. Instead, for example, four or more metal layers may be stacked. The layout and planar shape of the electrodes 31, 41, and 51 and the wirings 33, 34, 35, 36, 45, 46, 55, and 56 may be modified and changed in various manners.

In the embodiment, in the steps illustrated in FIGS. 16 and 17, the metal plate 30A, the metal plate 40A, and the metal plate 50A are simultaneously diffusion-bonded. Instead, for example, the metal plate 30A, the metal plate 40A, and the metal plate 50A may be separately diffusion-bonded. In this case, first, for example, the metal plate 40A is diffusion-bonded to the upper surface of the metal plate 30A. Then, the metal plate 50A is diffusion-bonded to the upper surface of the metal plate 40A.

In the above embodiment, a method for manufacturing a batch of wiring substrates is embodied. Instead, a method for manufacturing a single wiring substrate (one wiring substrate) may be embodied.

Clauses

This disclosure further encompasses the following embodiments.

1. A method for manufacturing a wiring substrate, the method including:

stamping or etching a metal plate to form a first metal plate including a first electrode and a wiring, the wiring including a mount portion for an electronic component;

stamping or etching a metal plate to form a second metal plate including a second electrode and a first opening;

stacking the second metal plate on an upper surface of the first metal plate so that the first electrode overlaps the second electrode in plan view and that the mount portion overlaps the first opening in plan view; and diffusion-bonding the second electrode to an upper surface of the first electrode.

2. The method according to clause 1, further including:

after diffusion-bonding the second electrode to the upper surface of the first electrode, mounting the electronic component on the mount portion exposed in the first opening; and forming an insulation layer that fills a space among the first metal plate, the second metal plate, and the electronic component and covers the electronic component.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:

a first metal plate including a first electrode and a wiring, the wiring including a mount portion for an electronic component; and a second metal plate including a second electrode diffusion-bonded to an upper surface of the first electrode, wherein the second metal plate includes a first opening that exposes the mount portion, and the first opening is large enough to accommodate the electronic component;

the first electrode includes a solid first body and a first projection projecting outward from a side surface of the first body and being thinner than the first body, the first projection defining a first recess in the first electrode;

the second electrode includes a solid second body diffusion-bonded to an upper surface of the first body and a second projection projecting outward from a side surface of the second body and being thinner than the second body, the second projection defining a second recess in the second electrode; and the wiring substrate further comprises an insulation layer covering the electronic component and filling the first opening, the first recess, and the second recess.

2. The wiring substrate according to claim 1, wherein the first metal plate includes a first frame portion, the first frame portion supporting the first electrode and the wiring, the second metal plate includes a second frame portion supporting the second electrode, the first frame portion includes:
a third recess that is thinner than the first body, and
first protrusions that are spaced apart from each other at a given interval and have a same thickness as the first body, the second frame portion includes:
a fourth recess that is thinner than the second body, and
second protrusions that are spaced apart from each other at a given interval and have a same thickness as the second body, and
the second protrusions are diffusion-bonded to upper surfaces of the first protrusions.

3. The wiring substrate according to claim 1, further comprising:

a third metal plate including a third electrode diffusion-bonded to an upper surface of the second electrode, wherein the third metal plate includes a second opening that exposes the mount portion, the second opening is large enough to accommodate the electronic component, and the second opening is located above the first opening.

4. The wiring substrate according to claim 3, further comprising:
the electronic component accommodated in the first opening and the second opening and mounted on the mount portion,
wherein an upper surface of the third electrode includes an electrode pad exposed from the insulation layer.

5. The wiring substrate according to claim 4, wherein a side surface of the first electrode includes an outer surface located toward a peripheral edge of the wiring substrate, and the outer surface of the first electrode and a lower surface of the first electrode are exposed from the insulation layer.

6. The wiring substrate according to claim 5, further comprising:
a metal layer continuously covering the outer surface of the first electrode and the lower surface of the first electrode.

7. The wiring substrate according to claim 1, further comprising:
the electronic component accommodated in the first opening and mounted on the mount portion,
wherein an upper surface of the second electrode includes an electrode pad exposed from the insulation layer.

8. The wiring substrate according to claim 7, wherein a side surface of the first electrode includes an outer surface located toward a peripheral edge of the wiring substrate, and the outer surface of the first electrode and a lower surface of the first electrode are exposed from the insulation layer.

9. The wiring substrate according to claim 8, further comprising:
a metal layer continuously covering the outer surface of the first electrode and the lower surface of the first electrode.

10. The wiring substrate according to claim 1, wherein the first metal plate includes a connection opening extending through the first metal plate and connected to the first opening.

11. The wiring substrate according to claim 10, wherein the first opening, the connection opening, the first recess, and the second recess are connected to one another.

12. An electronic device, comprising:
the wiring substrate according to claim 7; and
an electronic component mounted on the upper surface of the electrode pad.

13. An electronic device, comprising:
the wiring substrate according to claim 4; and
an electronic component mounted on the upper surface of the electrode pad.

14. A wiring substrate, comprising:
a first metal plate including a first electrode and a wiring, the wiring including a mount portion for an electronic component; and
a second metal plate including a second electrode diffusion-bonded to an upper surface of the first electrode, wherein
the second metal plate includes a first opening that exposes the mount portion, and the first opening is large enough to accommodate the electronic component;
the first electrode includes a solid first body;
the second electrode includes a solid second body diffusion-bonded to an upper surface of the first body;
the first metal plate includes a first frame portion, the first frame portion supporting the first electrode and the wiring,
the second metal plate includes a second frame portion supporting the second electrode,
the first frame portion includes:
a first recess that is thinner than the first body, and
first protrusions that are spaced apart from each other at a given interval and have a same thickness as the first body,
the second frame portion includes:
a second recess that is thinner than the second body, and
second protrusions that are spaced apart from each other at a given interval and have a same thickness as the second body, and
the second protrusions are diffusion-bonded to upper surfaces of the first protrusions.

15. The wiring substrate according to claim 14, wherein the first electrode includes a first projection projecting outward from a side surface of the first body and being thinner than the first body, and the second electrode includes a second projection projecting outward from a side surface of the second body and being thinner than the second body.

16. The wiring substrate according to claim 14, further comprising:
a third metal plate including a third electrode diffusion-bonded to an upper surface of the second electrode, wherein
the third metal plate includes a second opening that exposes the mount portion,
the second opening is large enough to accommodate the electronic component, and
the second opening is located above the first opening.

17. The wiring substrate according to claim 16, further comprising:
the electronic component accommodated in the first opening and the second opening and mounted on the mount portion; and
an insulation layer filling a space among the first metal plate, the second metal plate, the third metal plate, and the electronic component and covering the electronic component,
wherein an upper surface of the third electrode includes an electrode pad exposed from the insulation layer.

18. The wiring substrate according to claim 17, wherein a side surface of the first electrode includes an outer surface located toward a peripheral edge of the wiring substrate, and the outer surface of the first electrode and a lower surface of the first electrode are exposed from the insulation layer.

19. The wiring substrate according to claim 18, further comprising:
a metal layer continuously covering the outer surface of the first electrode and the lower surface of the first electrode.

20. The wiring substrate according to claim 14, further comprising:
the electronic component accommodated in the first opening and mounted on the mount portion; and
an insulation layer filling a space among the first metal plate, the second metal plate, and the electronic component and covering the electronic component,
wherein an upper surface of the second electrode includes an electrode pad exposed from the insulation layer.

21. The wiring substrate according to claim 20, wherein a side surface of the first electrode includes an outer surface located toward a peripheral edge of the wiring substrate, and the outer surface of the first electrode and a lower surface of the first electrode are exposed from the insulation layer.

22. The wiring substrate according to claim 21, further comprising:
a metal layer continuously covering the outer surface of the first electrode and the lower surface of the first electrode.

23. An electronic device, comprising:
the wiring substrate according to claim 20; and
an electronic component mounted on the upper surface of the electrode pad.

24. An electronic device, comprising:
the wiring substrate according to claim 17; and
an electronic component mounted on the upper surface of the electrode pad.

* * * * *